US 6,635,937 B2

(12) United States Patent
Ootsuka et al.

(10) Patent No.: US 6,635,937 B2
(45) Date of Patent: Oct. 21, 2003

(54) SEMICONDUCTOR INTEGRATED CIRCUIT DEVICE

(75) Inventors: Fumio Ootsuka, Tokorozawa (JP); Yusuke Nonaka, Tachikawa (JP); Satoshi Shimamoto, Ome (JP); Sohei Omori, Akiruno (JP); Hideto Kazama, Ome (JP)

(73) Assignee: Hitachi, Ltd., Tokyo (JP)

( * ) Notice: Subject to any disclaimer, the term of this patent is extended or adjusted under 35 U.S.C. 154(b) by 31 days.

(21) Appl. No.: 10/152,615

(22) Filed: May 23, 2002

(65) Prior Publication Data

US 2002/0190399 A1 Dec. 19, 2002

(30) Foreign Application Priority Data

Jun. 18, 2001 (JP) .......................... 2001-183098

(51) Int. Cl.⁷ .................... H01L 29/76; H01L 29/94; H01L 31/062; H01L 31/113; H01L 31/119
(52) U.S. Cl. ................. 257/379; 257/380; 257/381; 257/393
(58) Field of Search ................. 257/66, 67, 69, 257/379–381, 903, 904, 393

(56) References Cited

U.S. PATENT DOCUMENTS

| 5,754,467 A | 5/1998 | Ikeda et al. |
| 5,780,910 A | * 7/1998 | Hashimoto et al. ......... 257/393 |
| 5,798,551 A | 8/1998 | Kikushima et al. |

FOREIGN PATENT DOCUMENTS

WO   WO 02/061840   12/2001

OTHER PUBLICATIONS

F. Ootsuka, M. Nakamuira, T. Miyake, S. Iwahashi, Y. Ohira, T. Tamaru, K. Kikushima and K. Yamaguchi, "A Novel 0.20 μm Full CMOS SRAM Cell Using Stacked Cross Couple with Enhanced Soft Error Immunity", 1998 IEEE, IEDM 98–205, pp. 98 205 to 98–208.

* cited by examiner

Primary Examiner—Thien Tran

(57) ABSTRACT

To improve performance, a capacitor is provided between storage nodes of an SRAM and a device having an analog capacitor on a single substrate, a plug is formed in a silicon oxide film on a pair of n channel type MISFETs in a memory cell forming area, and a local wiring LIc for connecting respective gate electrodes and drains of the pair of n channel type MISFETs is formed over the silicon oxide film and the plug. Thereafter, a capacitive insulating film and an upper electrode are formed over the local wiring LIc.

23 Claims, 39 Drawing Sheets

SEMICONDUCTOR INTEGRATED CIRCUIT DEVICE

TECHNICAL FIELD

The present invention relates to a semiconductor integrated circuit device and a technology for manufacturing the same, and particularly to a technology effective for application to a semiconductor integrated circuit device having an SRAM (Static Random Access Memory).

BACKGROUND OF THE INVENTION

An SRAM has been used as a cache memory used for a personal computer and a work station.

The SRAM comprises a flip-flop circuit for storing one-bit information therein and two information transfer MISFETs (Metal Insulator Semiconductor Field Effect Transistors). The flip-flop circuit comprises, for example, a pair of drive MISFETs and a pair of load MISFETs.

A problem associated with a soft error produced due to an α ray arises in each memory cell of such a memory. The soft error produced due to the α ray is a phenomenon in which an α ray contained in external cosmic radiation, or an α ray emitted from a radioactive atom contained in a package material for an LSI enters a memory cell and damages or corrupts information stored in the memory cell.

In order to take measures against such an α ray, a method has been discussed which adds a capacitor or capacitance to an information storage unit (corresponding to an input/output part of the flip-flop circuit) in the memory cell to thereby increase the capacitance of the information storage unit. The capacitance of such an information storage unit has been described in, for example, IEDM 1998, P205.

SUMMARY OF THE INVENTION

With recent high integration and scale-down of a semiconductor integrated circuit in particular, there is a tendency to reduce the area of each memory cell. As a result, information storage units, i.e., a pair of drive n channel type MISFETs and a pair of load p channel type MISFETs are reduced in distance therebetween and susceptible to an α ray. There is a tendency to reduce a source voltage (Vcc) for the purpose of a reduction in power consumption. Thus, the rate of occurrence of the soft error due to the α ray rises.

On the other hand, a so-called system LSI (Large Scale Integrated Circuit) has been discussed in which the above SRAM and, for example, a PLL (Phase Locked Loop) circuit or the like having an analog capacitor are formed on a single substrate.

As the analog capacitor used in the PLL circuit, for example, a capacitor is used wherein a semiconductor substrate (diffused layer) is used as a lower electrode, a gate insulating film formed on the semiconductor substrate is used as a capacitive insulating film, and a conductive film (e.g., polysilicon film) on the gate insulating film is used as an upper electrode.

However, a tunnel current occurs in such a capacitor with thinning of the gate insulating film. As a result, a leak current increases. Subsequently to a 0.13-μm generation, for example, one exceeding $1 \times 10^{-4} A/cm^2$ indicative of a target value of the leak current appears, thus inhibiting the normal operation of the PLL circuit.

When the capacitor is formed on the semiconductor substrate, it is affected by a substrate potential and a voltage characteristic of the capacitor will vary.

An object of the present invention is to provide a semiconductor integrated circuit device, e.g., a high-performance semiconductor integrated circuit device which reduces a soft error produced in each memory cell of an SRAM.

Another object of the present invention is to improve the performance of a semiconductor integrated circuit device, e.g., a system LSI wherein an SRAM and a device having an analog capacitor are formed on a single substrate.

The above objects and novel features of the present invention will become apparent from the description of the present specification and the accompanying drawings.

Summaries of typical ones of the inventions disclosed in the present application will be described in brief as follows:

(1) A semiconductor integrated circuit device according to the present invention has a pair of conductive layers which electrically connects gate electrodes and drains of a pair of n channel type MISFETs constituting each of memory cells, a capacitive insulating film formed on the pair of conductive layers and having an opening provided on any one of the pair of conductive layers, and an upper electrode formed on the capacitive insulating film and the opening. The pair of conductive layers may be formed in the interlayer insulating film. Further, upper portions of the conductive layers may protrude from the surface of the interlayer insulating film. An area for forming the upper electrode may be formed wider than an area for forming each conductive layer, and the upper electrode may be formed so as to contain the conductive layer forming area.

(2) There is provided a second area in addition to a first area in which the memory cell is formed. The second area may be formed with other capacitors respectively formed in the same layer as the conductive layers, capacitive insulating film and upper electrode formed in the first area.

(3) A method of manufacturing a semiconductor integrated circuit device, according to the present invention includes a step of defining wiring trenches in an interlayer insulating film on a pair of n channel type MISFETs constituting each of memory cells, and embedding a conductive film therein to thereby form a pair of conducive layers which electrically connects gate electrodes and drains of the pair of n channel type MISFETs, a step of forming a capacitive insulating film over the pair of conductive layers, a step of selectively removing the capacitive insulating film on any one of the pair of conductive layers to thereby define an opening, and a step of depositing a conductive film on the capacitive insulating film including the interior of the opening and etching it to thereby form an upper electrode. After the formation of the pair of conductive layers, the surface of the interlayer insulating film may be etched so as to expose side walls of the pair of conductive layers. A second area is provided in addition to a first area formed with the memory cell. Other capacitor may be formed in the second area in the same step as the step of forming each of the pair of conductive layers, capacitive insulating film and upper electrode.

DETAILED DESCRIPTION OF THE PREFERRED EMBODIMENTS

Figure 1:
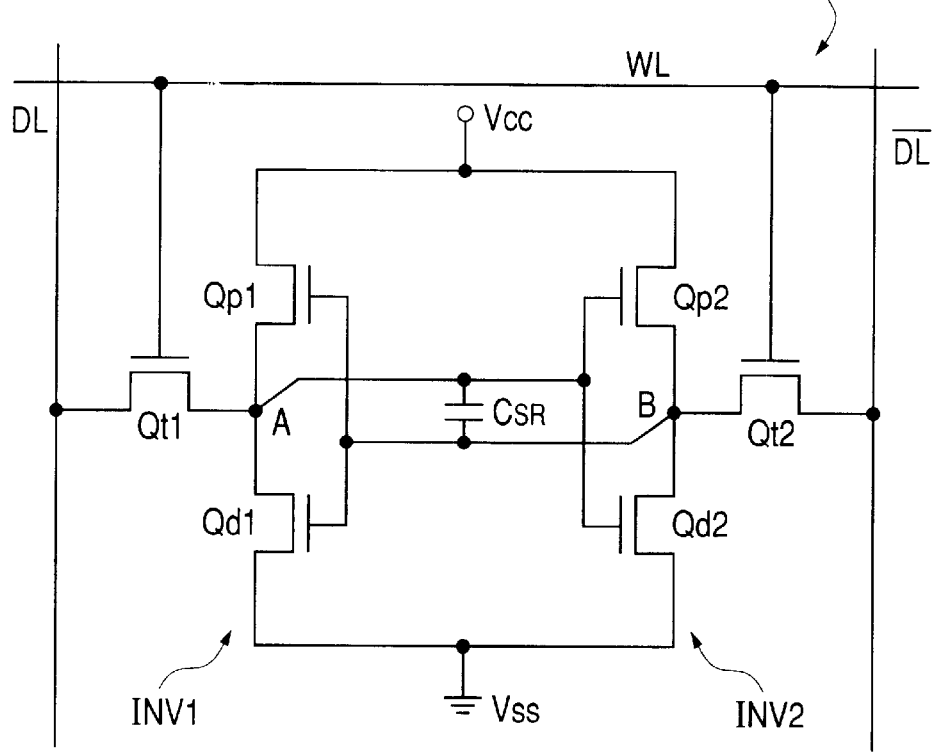
FIG. 1 is an equivalent circuit diagram showing a memory cell of a SRAM in a semiconductor integrated circuit device illustrative of a first embodiment of the present invention.

Preferred embodiments of the present invention will hereinafter be described in detail with reference to the accompanying drawings. Incidentally, structural components or members each having the same function in all the drawings for describing the embodiments are respectively identified by the same reference numerals and their repetitive description will therefore be omitted.

First Embodiment

FIG. 1 is an equivalent circuit diagram showing a memory cell of a SRAM illustrative of the first embodiment. As shown in the drawing, the memory cell MC is placed in a portion where a pair of complementary data lines (a data line DL and a data line/(bar) DL) and a word line WL intersect, and comprises a pair of drive MISFETs Qd1 and Qd2, a pair of load MISFETs Qp1 and Qp2, and a pair of transfer MISFETs Qt1 an Qt2. The drive MISFETs Qd1 and Qd2 and the transfer MISFETs Qt1 and Qt2 respectively comprise n channel type MISFETs, whereas the load MISFETs Qp1 and Qp2 comprise p channel type MISFETs respectively.

In the six MISFETs constituting the memory cell MC, the drive MISFET Qd1 and the load MISFET Qp1 constitute a CMOS inverter INV1, and the drive MISFET Qd2 and the load MISFET Qp2 constitute a CMOS inverter INV2. Mutual input/output terminals (storage nodes A and B) of one pair of these CMOS inverters INV1 and INV2 are coupled to each other so as to intersect and constitute a flip-flop circuit used as an information storage unit for storing one-bit information therein. One input/output terminal (storage node A) of the flip-flop circuit is connected to one of source and drain regions of the transfer MISFET Qt1, whereas the other input/output terminal (storage node B) thereof is connected to one of source and drain regions of the transfer MISFET Qt2.

Further, the other of the source and drain regions of the transfer MISFET Qt1 is connected to one of the complementary data line DL, and the other of the source and drain regions of the transfer MISFET Qt2 is connected to another of the complementary data line/DL. One ends (source regions of load MISFETs Qp1 and Qp2) of the flip-flop circuit are connected to a source voltage (Vcc), whereas the other ends (source regions of drive MISFETs Qd1 and Qd2) are connected to a ground (reference) voltage (Vss).

The operation of the above circuit will be explained. When the storage node A of one CMOS inverter INV1 is of a high potential ("H"), the drive MISFET Qd2 is turned ON, so that the storage node B of the other CMOS inverter INV2 is brought to a low potential ("L"). Thus, the drive MISFET Qd1 is turned OFF so that the high potential ("H") of the storage node A is held. Namely, the states of the mutual storage nodes A and B are held by a latch circuit wherein the pair of CMOS inverters INV1 and INV2 are cross-connected to each other, and hence information is stored therein while the source voltage is being applied.

The word line WL is connected to respective gate electrodes of the transfer MISFETs Qt1 and Qt2, and controls electrical conduction and non-conduction of the transfer MISFETs Qt1 and Qt2. Namely, when the word line WL is of a high potential ("H"), the transfer MISFETs Qt1 and Qt2 are turned ON so that the flip-flop circuit and the complementary data lines (data lines DL and /DL) are electrically connected to each other. Therefore the potential states ("H" or "L") of the storage nodes A and B appear on the data lines DL and /DL, which in turn are read as information for the memory cell MC.

In order to write information into the memory cell MC, the word line WL is brought to an "H" potential level and the transfer MISFETs Qt1 and Qt2 are respectively brought to an ON state to thereby transfer the information on the data lines DL and /DL to the storage nodes A and B. A capacitor $C_{SR}$ is added between the storage nodes A and B to take measures against alpha rays.

Figure 2:
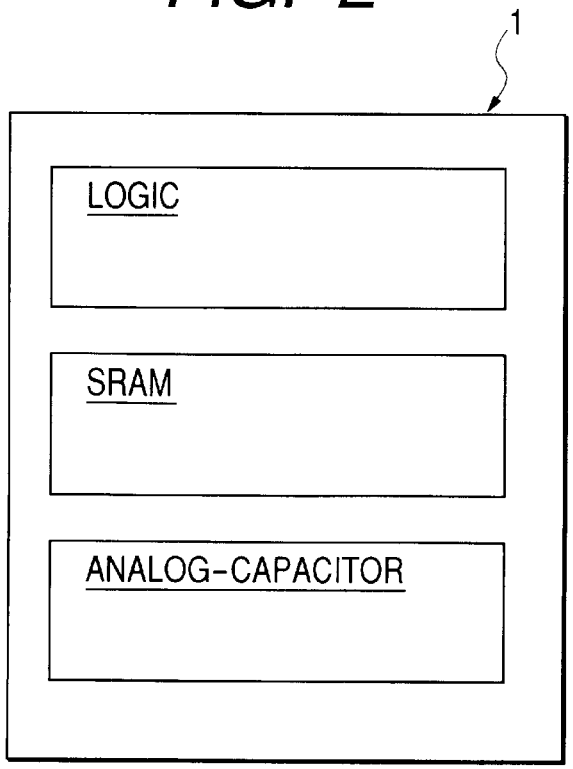
FIG. 2 is a fragmentary plan view of a substrate showing a method of manufacturing the semiconductor integrated circuit device illustrating the first embodiment of the present invention.

Such a memory cell of SRAM is formed in a memory cell forming area (SRAM) shown in FIG. 2. For instance, a logic circuit forming area (Logic) and an analog capacitor forming area (Analog Capacitor) exist around the memory cell forming area. As will be described later, for example, an n channel MISFET Qn and a p channel MISFET Qp constituting a logic circuit are formed in the logic circuit forming area (Logic), and an analog capacitor $C_{AN}$ is formed in the analog capacitor forming area (Analog Capacitor). These memory cell forming area (SRAM), logic circuit forming area (Logic) and analog capacitor forming area (Analog Capacitor) are formed on a single semiconductor substrate 1.

A semiconductor integrated circuit device according to the present embodiment will next be described in accordance with its manufacturing process. FIGS. 3 through 39 are respectively fragmentary cross-sectional views or plan views of a substrate, showing a method of manufacturing the semiconductor integrated circuit device according to the present embodiment.

Figure 3:
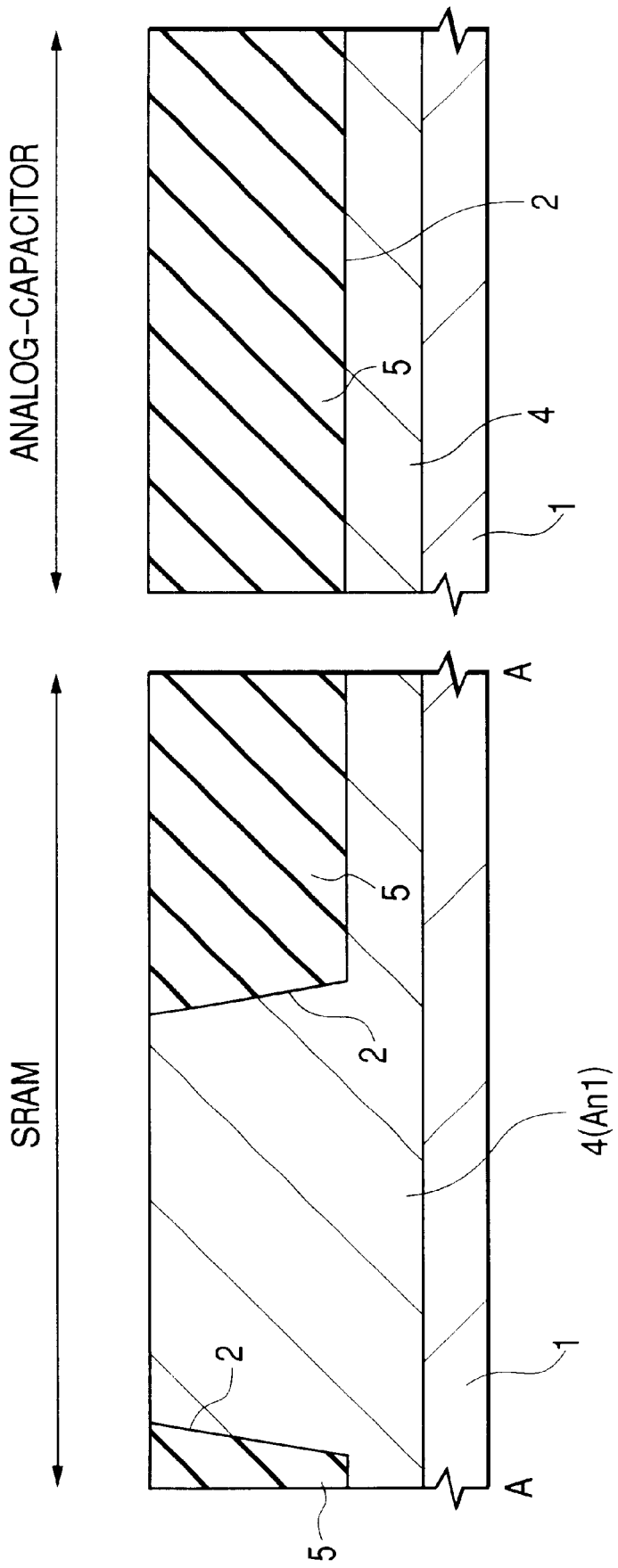
FIG. 3 is a fragmentary cross-sectional view of the substrate showing the method of manufacturing the semiconductor integrated circuit device illustrating the first embodiment of the present invention.
Figure 4:
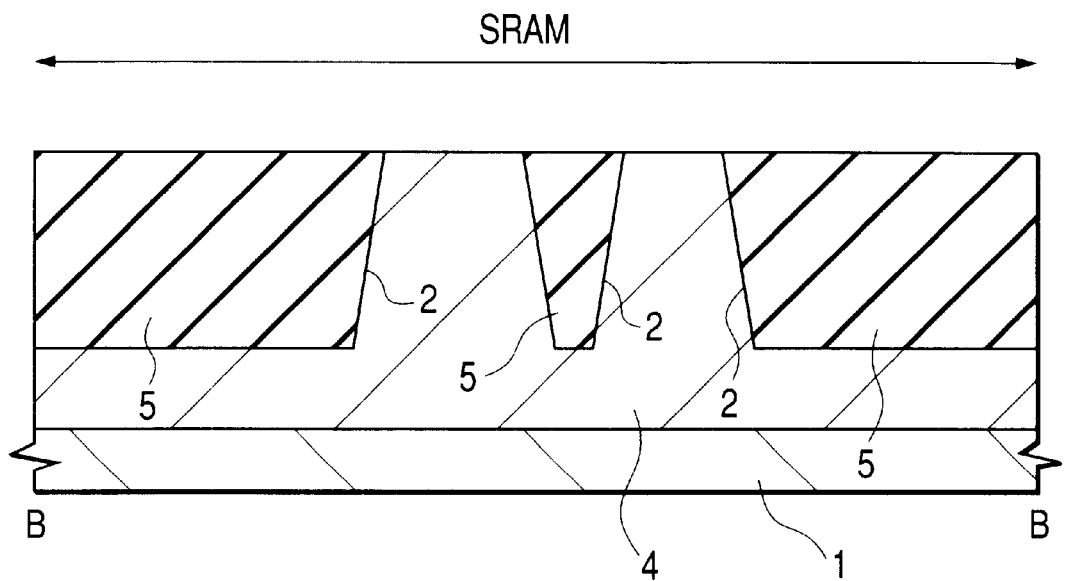
FIG. 4 is a fragmentary cross-sectional view of the substrate showing the method of manufacturing the semiconductor integrated circuit device illustrating the first embodiment of the present invention.
Figure 5:
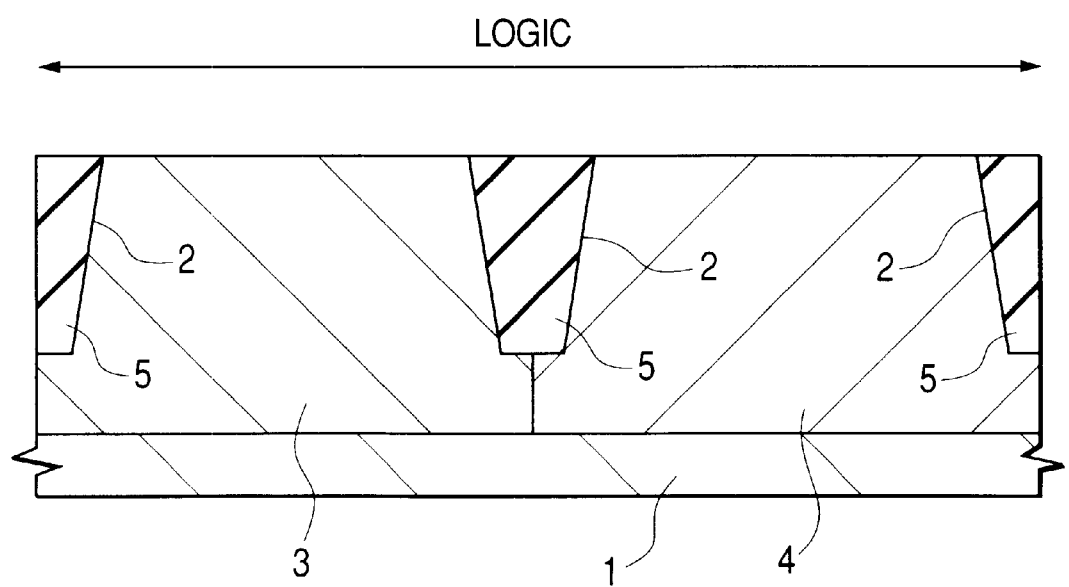
FIG. 5 is a fragmentary cross-sectional view of the substrate showing the method of manufacturing the semiconductor integrated circuit device illustrating the first embodiment of the present invention.
Figure 6:
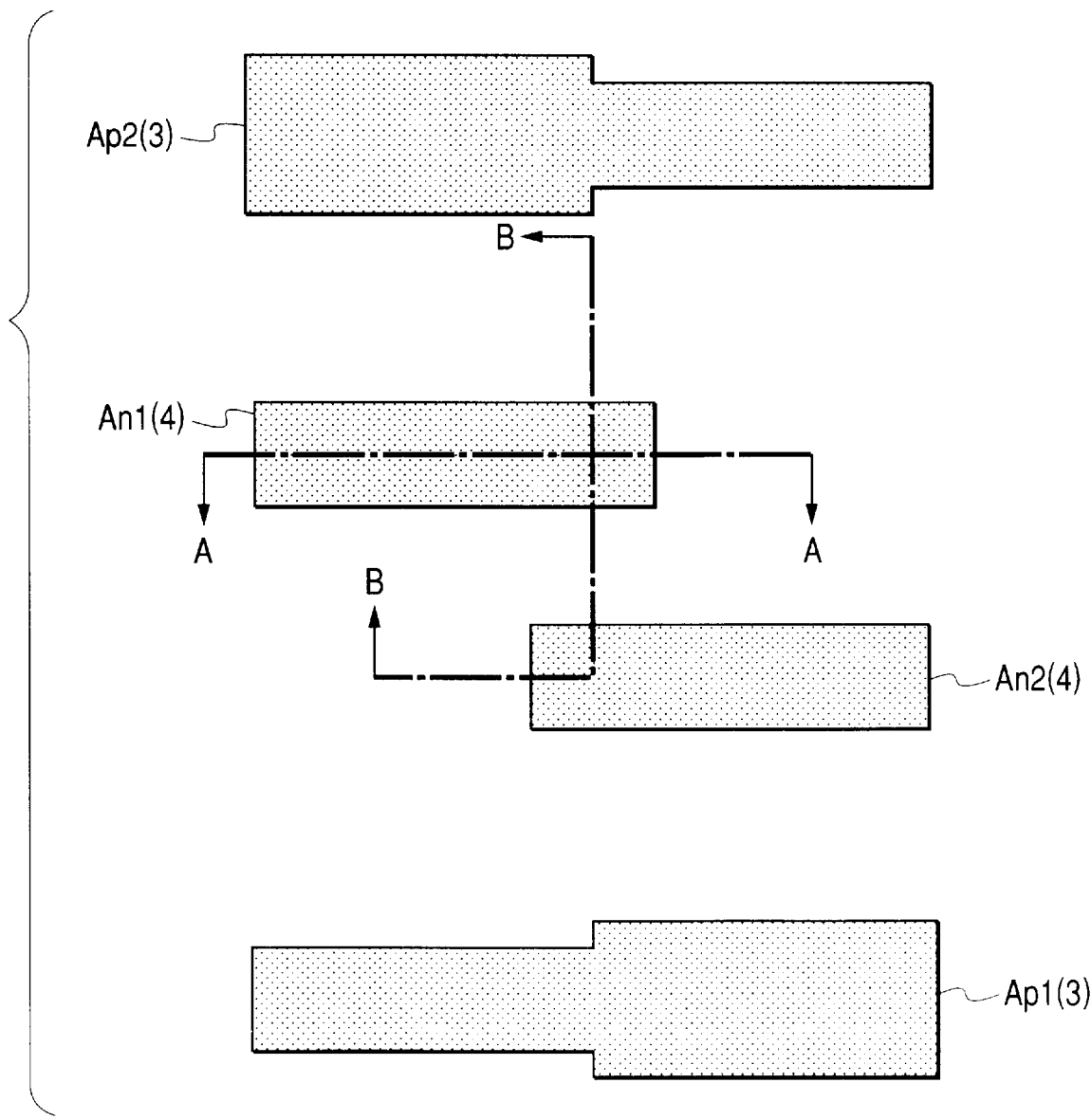
FIG. 6 is a fragmentary plan view of the substrate showing the method of manufacturing the semiconductor integrated circuit device illustrating the first embodiment of the present invention.

As shown in FIGS. 3 through 6, device isolators 2 are first formed in a semiconductor substrate 1. Now, FIG. 6 is a plan view of the semiconductor substrate showing an area or region corresponding to about one memory cell formed in the memory cell forming area (SRAM). The drawing on the left side of FIG. 3 is a cross-sectional view taken along line A—A of FIG. 6, and FIG. 4 is a cross-sectional view taken along line B—B of FIG. 6. The drawing on the right side of FIG. 3 is a cross-sectional view of the analog capacitor forming area (Analog Capacitor) and FIG. 5 is a cross-sectional view of the logic circuit forming area (Logic).

The device isolators 2 are formed as follows. A semiconductor substrate 1 comprising p type monocrystalline silicon having a resistivity which ranges from about 1 Ωcm to about 10 Ωcm, for example, is etched to form device isolation trenches each having a depth of about 250 nm.

Thereafter, the semiconductor substrate 1 is subjected to thermal oxidation at about 1000° C., for example, to thereby form a thin silicon oxide film (not shown) having a thickness of about 10 nm within inner walls of the trenches. The silicon oxide film is formed to recover dry-etching damage that occurred in the inner walls of the trenches and relax stress developed in a boundary face between a silicon oxide film 5 embedded inside the trenches in the next process step and the semiconductor substrate 1.

Next, an insulating film comprising a silicon oxide film 5 having a thickness ranging from about 450 nm to about 500 nm is deposited over the semiconductor substrate 1 including the interiors of the trenches by a CVD (Chemical Vapor Deposition) method. The silicon oxide film 5 lying over the trenches are polished or ground by a CMP (Chemical Mechanical Polishing) method to flatten its surface.

Next, for example, a p type impurity (boron) and an n type impurity (e.g., phosphor) are ion-implanted in the semiconductor substrate 1 and thereafter diffused by heat treatment at about 1000° C. to thereby form p type wells (regions) 3 and n type wells (regions) 4 in the semiconductor substrate 1.

As a result, as shown in the left drawing of FIG. 3, FIG. 4 and FIG. 6, active regions An1, An2, Ap1 and Ap2 corresponding to main surfaces of the p type wells 3 and n type wells 4 are formed in the semiconductor substrate 1 in the memory cell forming area (SRAM). These active regions are surrounded with the device isolators 2 with the silicon oxide film 5 used as the insulating film embedded therein.

As shown in FIG. 5, p type and n type wells 3 and 4 are formed on the semiconductor substrate 1 in the logic circuit forming area (Logic).

As shown on the right side of FIG. 3, the analog capacitor forming area (Analog Capacitor) is covered with the corresponding device isolator 2.

As will further be described in detail, six MISFETs (Qt1, Qt2, Qd1, Qd2, Qp1 and Qp2) constituting a memory cell MC are formed on a main surface of the semiconductor substrate 1 in the memory cell forming area (SRAM). n channel type MISFETs (Qt1 and Qd1) thereof are formed on the active region Ap1 (p type well 3), and n channel type MISFETs (Qt2 and Qd2) thereof are formed on the active region Ap2 (p type well 3). Further, a p channel type MISFET (Qp2) thereof is formed on the active region An1 (n type well 4), and a p channel type MISFET (Qp1) thereof is formed on the active region An2 (n type well 4)(see FIG. 10).

Further, an n channel type MISFET Qn, which constitutes a logic circuit, is formed in its corresponding p type well 3 in the logic circuit forming area (Logic), and a p channel type MISFET Qn, which constitutes a logic circuit, is formed in its corresponding n type well 4.

A cleaning fluid of hydrofluoric acid, for example, is next used to wet-clean the surface of the semiconductor substrate 1 (p type wells 3 and n type wells 4). Thereafter, as shown in FIGS. 7 through 10, a clean gate oxide film (gate insulating film) 8 having a thickness of about 6 nm is formed on the respective surfaces of the p type wells 3 and n type wells 4 under thermal oxidation at about 800° C.

Figure 7:
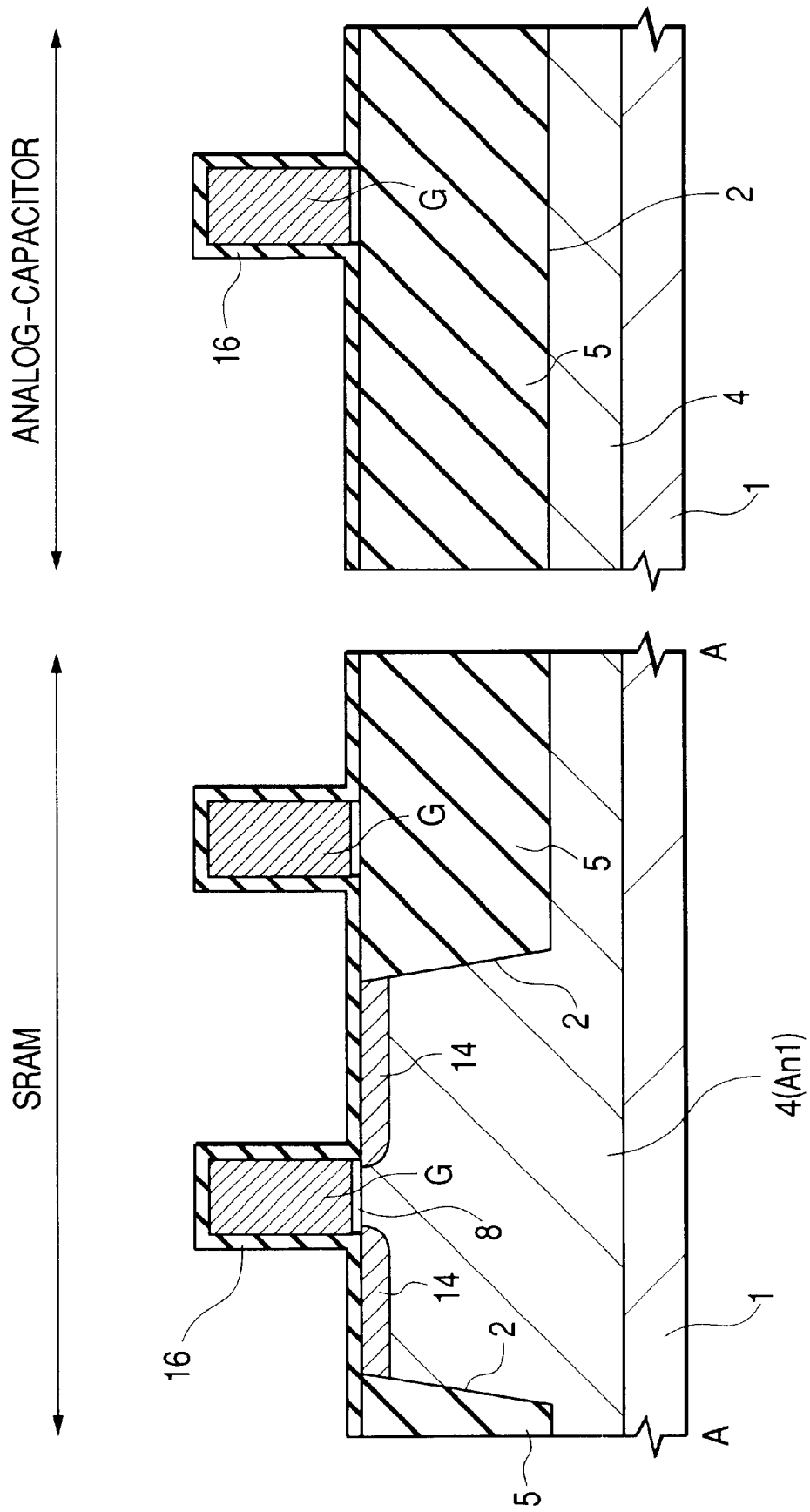
FIG. 7 is a fragmentary cross-sectional view of the substrate showing the method of manufacturing the semiconductor integrated circuit device illustrating the first embodiment of the present invention.
Figure 8:
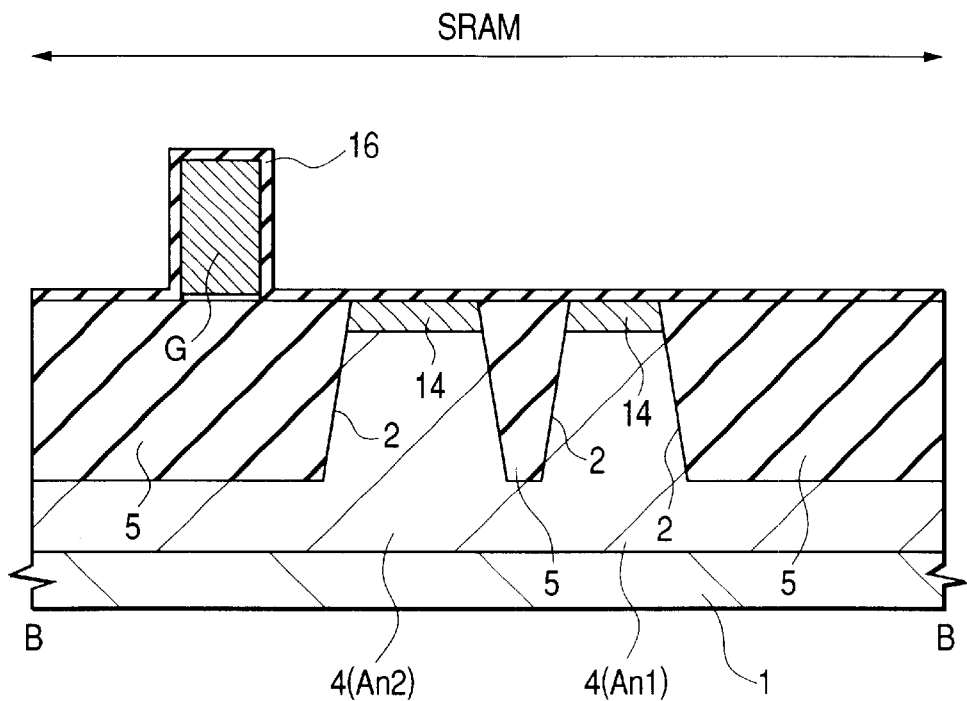
FIG. 8 is a fragmentary cross-sectional view of the substrate showing the method of manufacturing the semiconductor integrated circuit device illustrating the first embodiment of the present invention.
Figure 9:
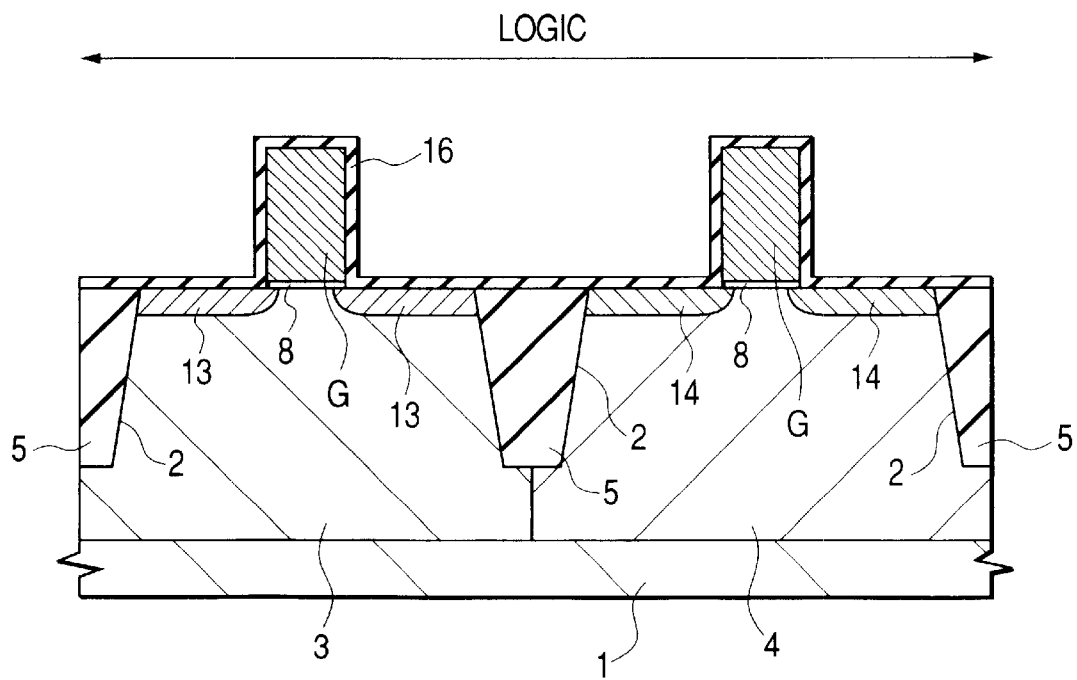
FIG. 9 is a fragmentary cross-sectional view of the substrate showing the method of manufacturing the semiconductor integrated circuit device illustrating the first embodiment of the present invention.
Figure 10:
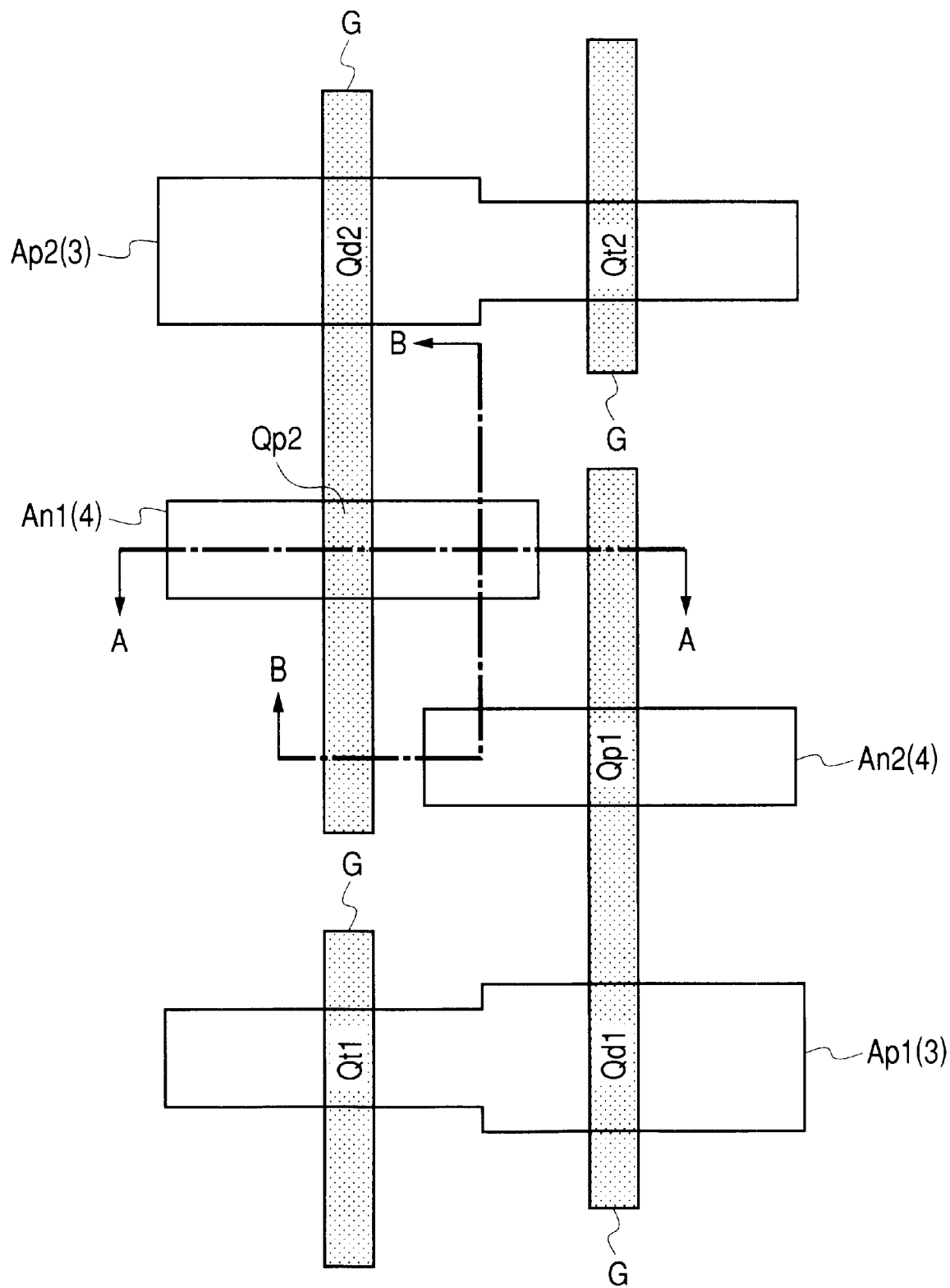
FIG. 10 is a fragmentary plan view of the substrate showing the method of manufacturing the semiconductor integrated circuit device illustrating the first embodiment of the present invention.

Next, gate electrodes G are formed on the gate oxide film 8. Now, FIG. 10 is a plan view of a semiconductor substrate showing the region equivalent to about one memory cell formed in its corresponding memory cell forming area (SRAM). The drawing on the left side of FIG. 7 is a cross-sectional view taken along line A—A of FIG. 10. FIG. 8 is a cross-sectional view taken along line B—B of FIG. 10. The drawing on the right side of FIG. 7 is a cross-sectional view of an analog capacitor forming area (Analog Capacitor). FIG. 9 is a cross-sectional view of a logic circuit forming area (Logic).

The gate electrodes G are formed as follows. A low-resistance polycrystalline silicon film 9 having a thickness of, for example, about 100 nm is first deposited over the gate oxide film 8 by the CVD method.

Next, the polycrystalline silicon film 9 is dry-etched with, for example, a photoresist film (not shown) as a mask to thereby form gate electrodes G which comprise the polycrystalline silicon film 9.

As shown in FIG. 10, the left drawing of FIG. 7 and FIG. 8, a gate electrode G of a transfer MISFET Qt1 and a gate electrode G of a drive MISFET Qd1 are formed on their corresponding active region Ap1 in the memory cell forming area (SRAM), whereas a gate electrode G of a transfer MISFET Qt2 and a gate electrode G of a drive MISFET Qd2 are formed on their corresponding active region Ap2. Further, a gate electrode G of a load MISFET Qp2 is formed on its corresponding active region An1, and a gate electrode G of a load MISFET Qp1 is formed on its corresponding active region An2. These gate electrodes are respectively formed in the direction orthogonal to line A—A in the drawing. The gate electrode G of the load MISFET Qp1 and the gate electrode of the drive MISFET Qd1 are common, and the gate electrode of the load MISFET Qp2 and the gate electrode of the drive MISFET Qd2 are common.

The gate electrodes G are formed even over the semiconductor substrate 1 (p type well 3 and n type well 4) in the logic circuit forming area (Logic) (see FIG. 9). Further, a gate electrode G, which plays the role of wiring, is formed on its corresponding device isolator 2 in the analog capacitor forming area (Analog Capacitor) (see the right drawing of FIG. 7).

Next, for example, the n type impurity (phosphor) is implanted in both sides of the gate electrode G on each p type well 3 to thereby form n⁻ type semiconductor regions 13. Further, a p type impurity (arsenic) is implanted in the n type well 4 from thereabove to thereby form p⁻ type semiconductor regions 14.

Next, a silicon oxide film 16 is deposited on the semiconductor substrate 1 by the CVD method, for example. The silicon oxide film functions as an etching stopper at the formation of sidewall spacers 16s to be described later.

Further, an insulating film comprising a silicon nitride film is deposited on the silicon oxide film 16 by the CVD method, for example, and thereafter anisotropically etched to thereby form sidewall spacers 16s formed of the insulating film on their corresponding side walls of each gate electrode G as shown in FIGS. 11 through 14. At this time, the etching of the silicon nitride film is performed on condition that a selection ratio can be taken with respect to the silicon oxide film 16 placed therebelow, thereby preventing the etching of the surface of the semiconductor substrate 1 (p type well 3 and n type well 4). Next, the silicon oxide film 16 is etched with the sidewall spacers 16s as masks. At this time, the etching of the silicon oxide film 16 is performed on condition that a selection ratio can be taken with respect to the semiconductor substrate 1 (p type well 3 and n type well 4) placed therebelow.

Next, for example, the n type impurity (phosphor or arsenic) is ion-implanted in the p type wells 3 to thereby form $n^+$ type semiconductor regions (source and drain), and a p type impurity (boron) is ion-implanted the n type wells 4 to thereby form $p^+$ type semiconductor regions 18 (source and drain).

Figure 11:
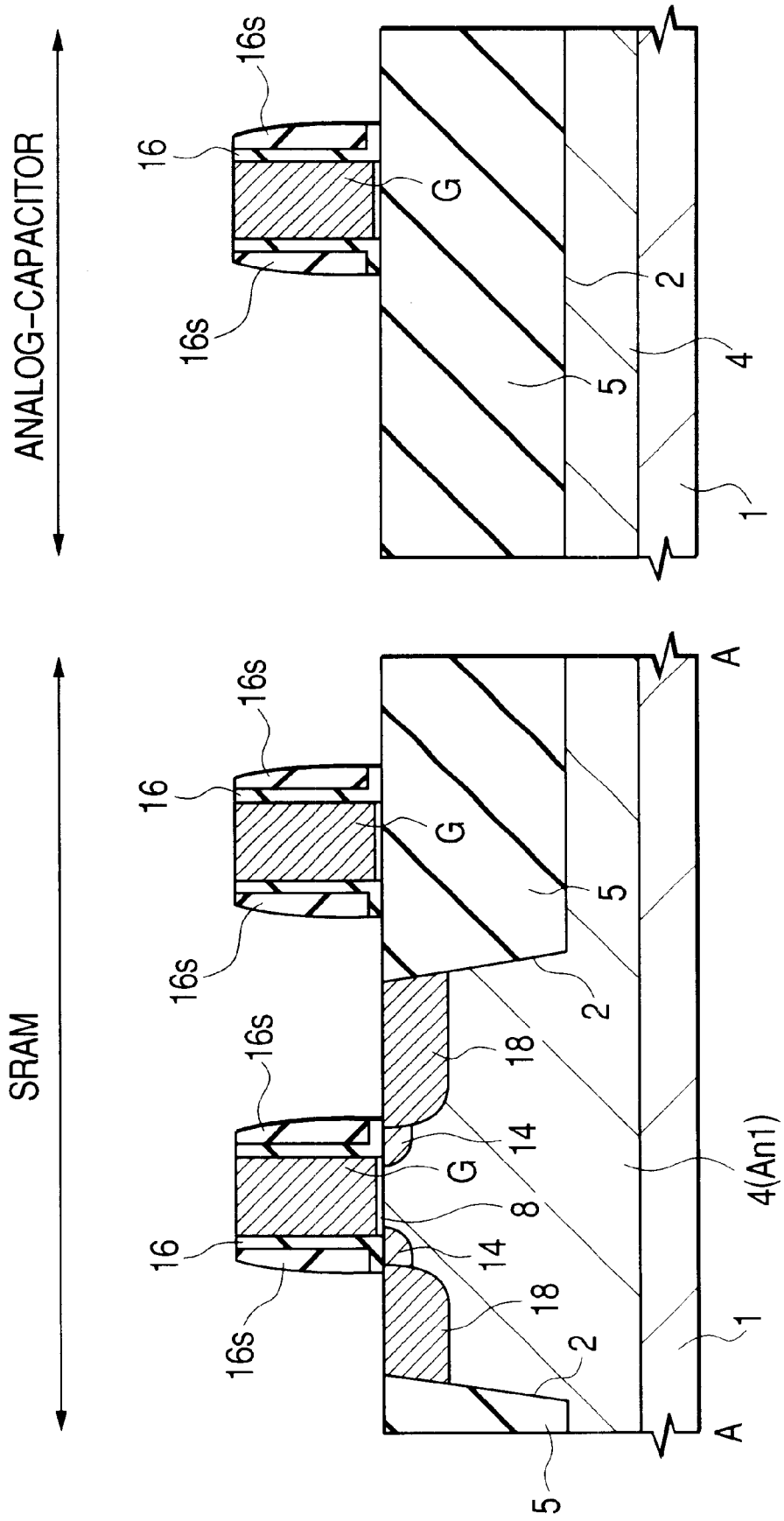
FIG. 11 is a fragmentary cross-sectional view of the substrate showing the method of manufacturing the semiconductor integrated circuit device illustrating the first embodiment of the present invention.
Figure 12:
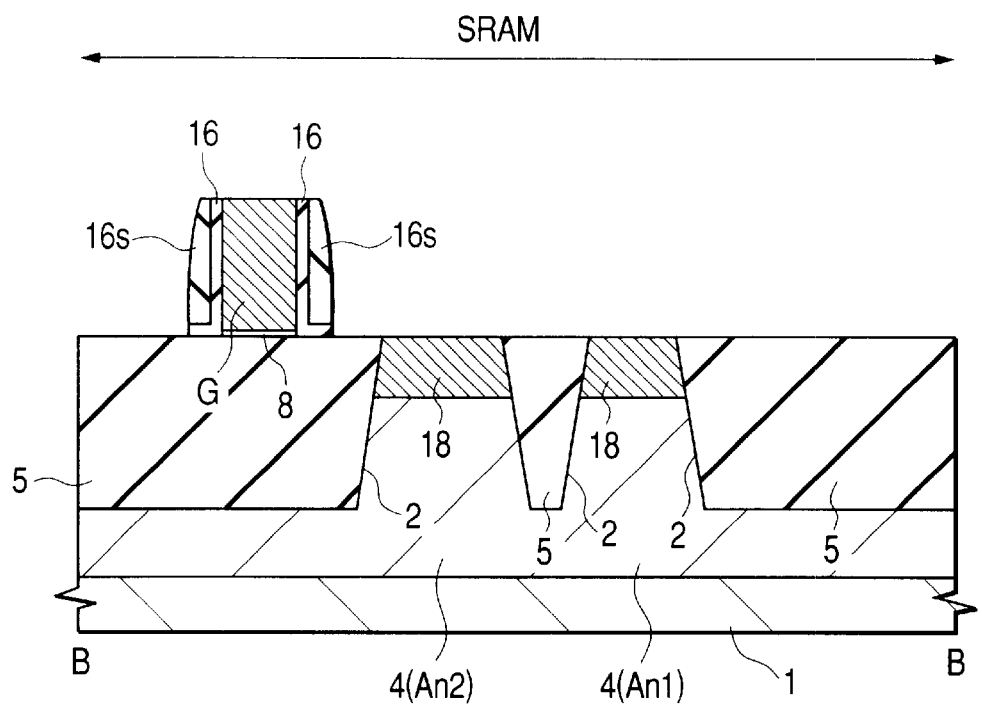
FIG. 12 is a fragmentary cross-sectional view of the substrate showing the method of manufacturing the semiconductor integrated circuit device illustrating the first embodiment of the present invention.
Figure 13:
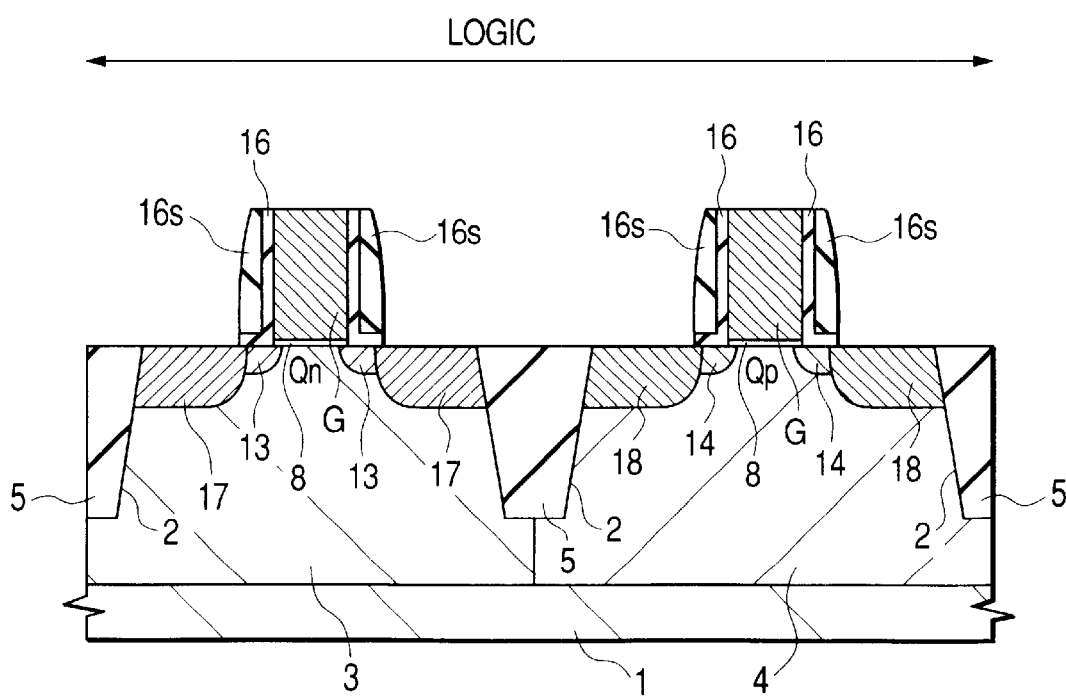
FIG. 13 is a fragmentary cross-sectional view of the substrate showing the method of manufacturing the semiconductor integrated circuit device illustrating the first embodiment of the present invention.
Figure 14:
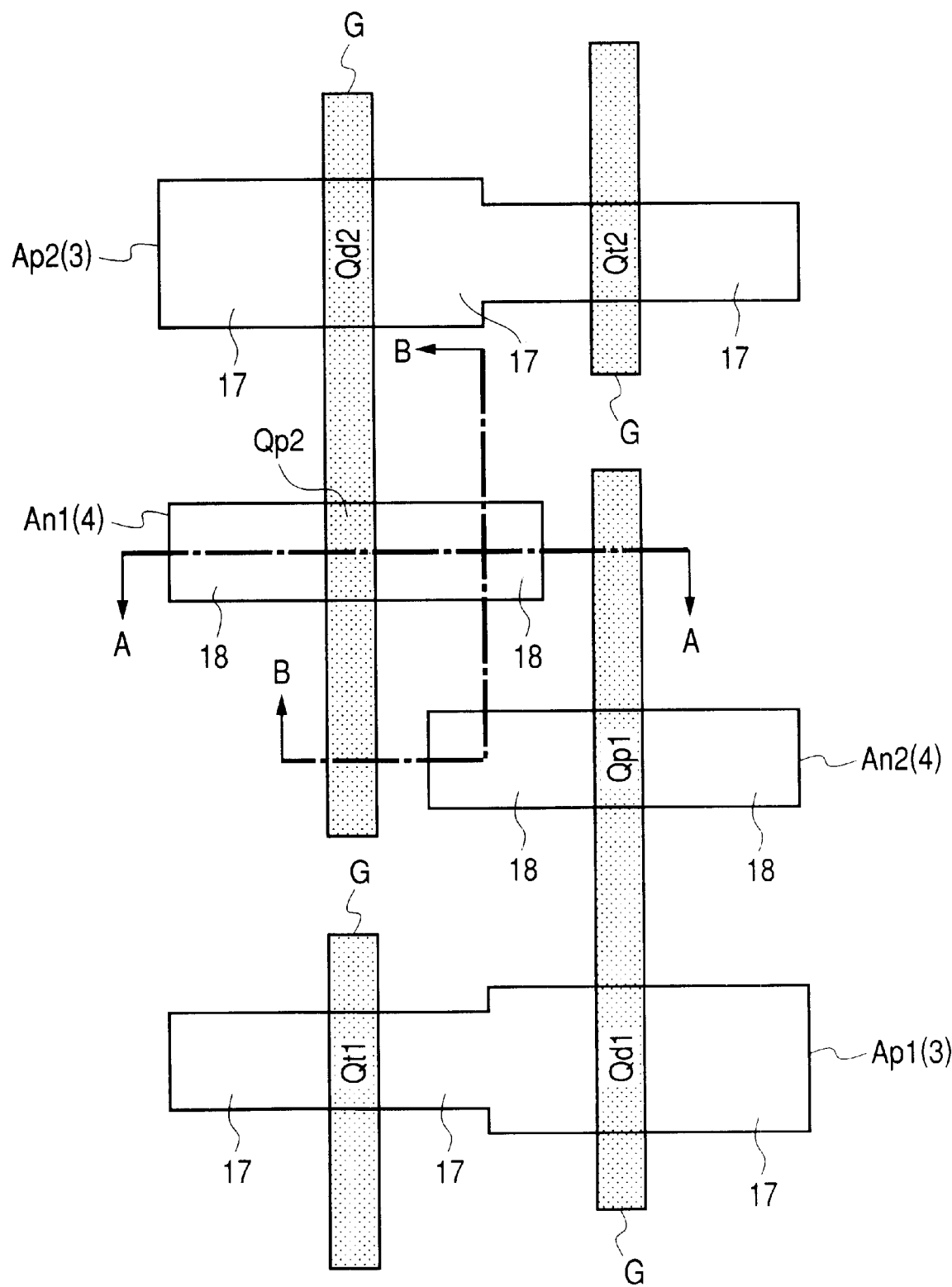
FIG. 14 is a fragmentary plan view of the substrate showing the method of manufacturing the semiconductor integrated circuit device illustrating the first embodiment of the present invention.

Now, FIG. 14 is a plan view of the semiconductor substrate showing the region or area corresponding to about one memory cell formed in its corresponding memory cell forming area (SRAM). The drawing on the left side of FIG. 11 is a cross-sectional view taken along line A—A of FIG. 14. FIG. 12 is a cross-sectional view taken along line B—B of FIG. 14. The drawing on the right side of FIG. 11 is a cross-sectional view of an analog capacitor forming area (Analog Capacitor). FIG. 13 is a cross-sectional view of a logic circuit forming area (Logic).

In the process steps used up to here, the six MISFETs (drive MISFETs Qd1 and Qd2, transfer MISFETs Qt1 and Qt2 and load MISFETs Qp1 and Qp2), which constitute the memory cell MC, are completed in the memory cell forming area (SRAM). Further, the n channel type MISFET Qn and p channel type MISFET Qp are completed in the logic circuit forming area (Logic).

Figure 15:
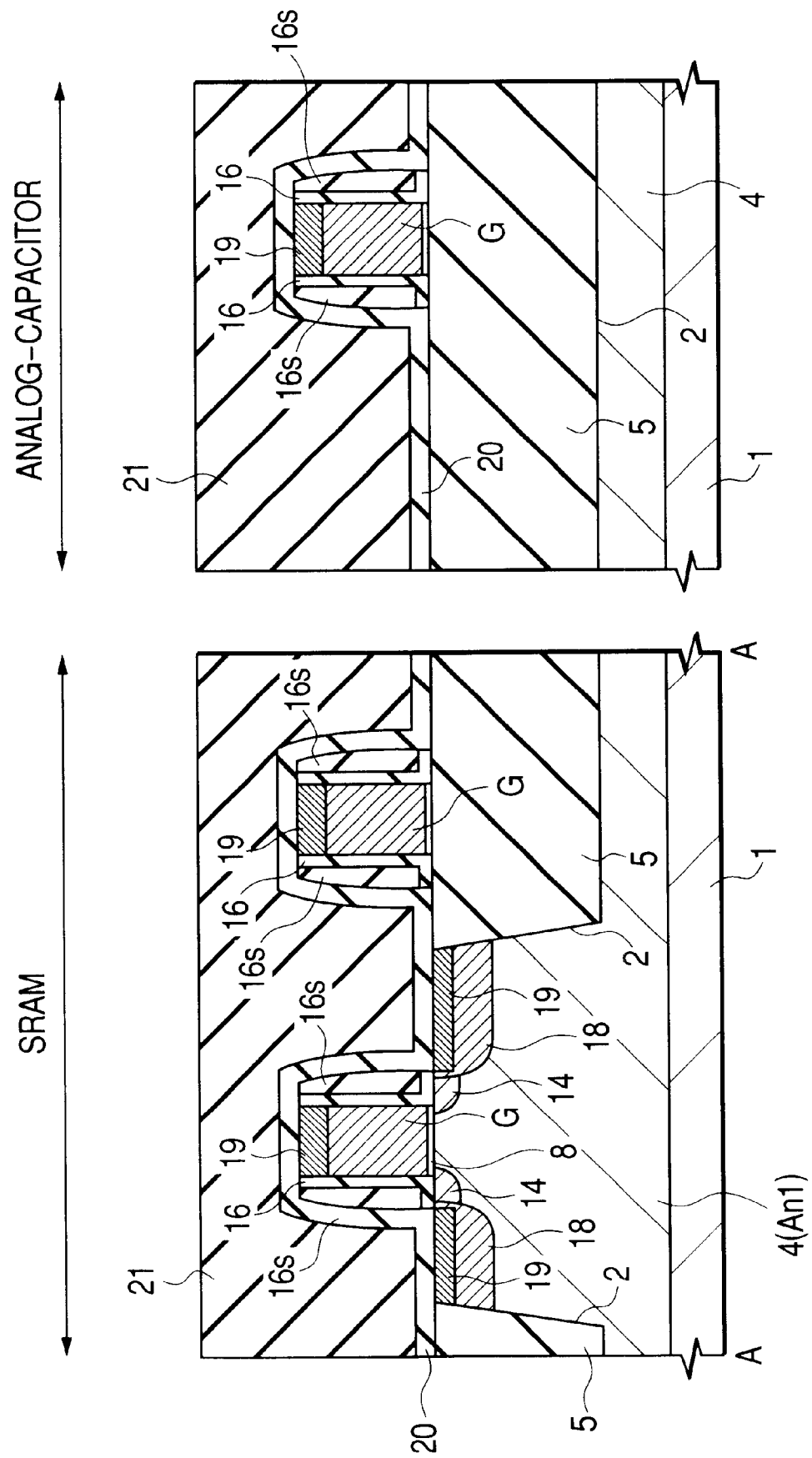
FIG. 15 is a fragmentary cross-sectional view of the substrate showing the method of manufacturing the semiconductor integrated circuit device illustrating the first embodiment of the present invention.
Figure 16:
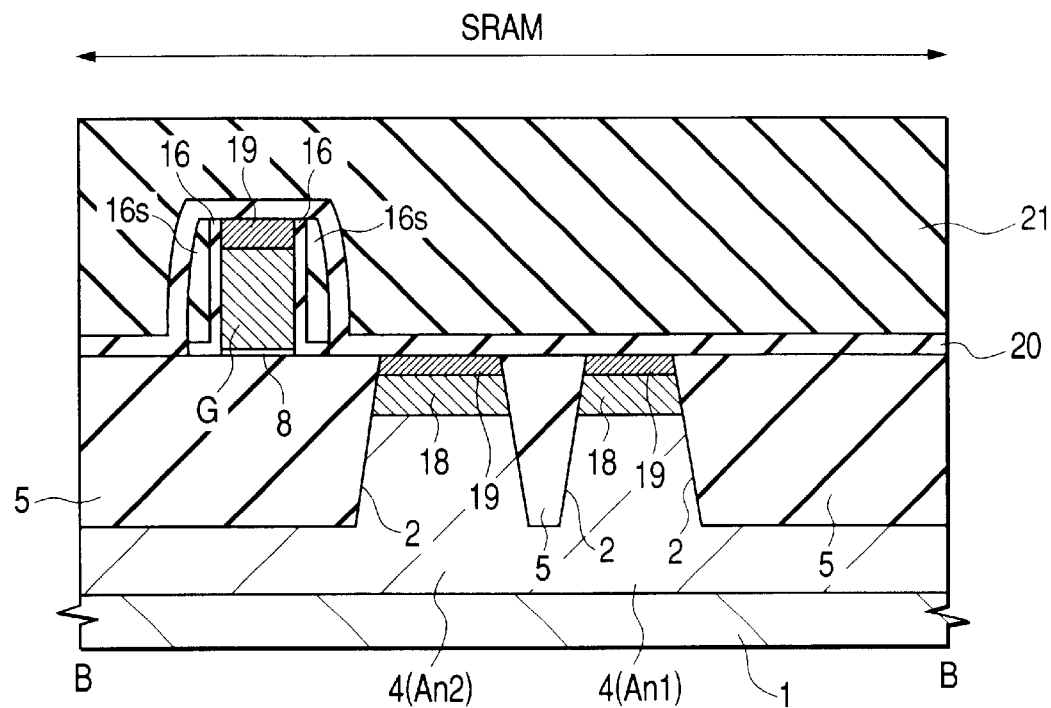
FIG. 16 is a fragmentary cross-sectional view of the substrate showing the method of manufacturing the semiconductor integrated circuit device illustrating the first embodiment of the present invention.
Figure 17:
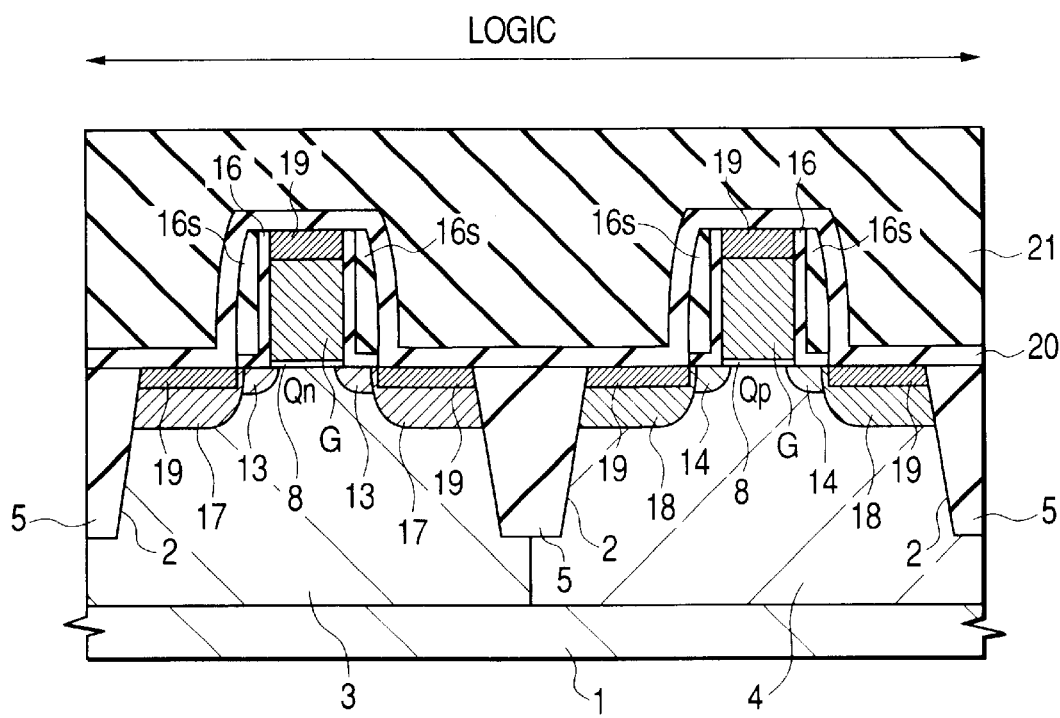
FIG. 17 is a fragmentary cross-sectional view of the substrate showing the method of manufacturing the semiconductor integrated circuit device illustrating the first embodiment of the present invention.
Figure 18:
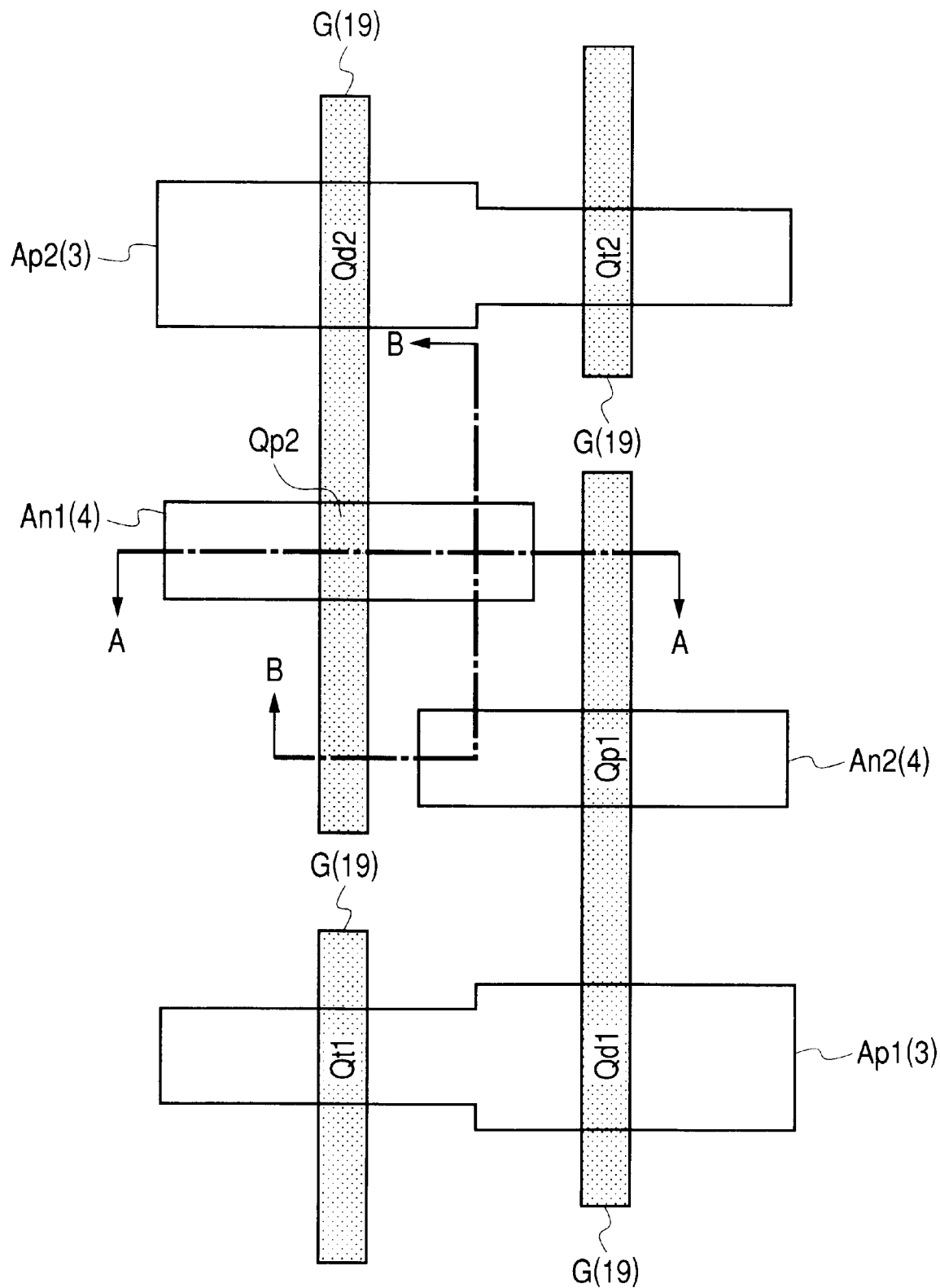
FIG. 18 is a fragmentary plan view of the substrate showing the method of manufacturing the semiconductor integrated circuit device illustrating the first embodiment of the present invention.

Subsequently, as shown in FIGS. 15 through 18, for example, the surface of the semiconductor substrate 1 is cleaned and thereafter a metal film such as a Co film, an Ni film or a Ti film or the like is deposited over the semiconductor substrate 1 by a sputtering method. Next, the so-processed semiconductor substrate is heat-treated at 600° C. for one minute to form metal silicide (silicide) layers 19 such as $CoSi_2$, NiSi or TiSi or the like on exposed portions ($n^+$ type semiconductor regions 17 and $p^+$ type semiconductor regions 18) of the semiconductor substrate 1 and the gate electrodes G. Now, FIG. 18 is a plan view of the semiconductor substrate showing the region corresponding to about one memory cell formed in its corresponding memory cell forming area (SRAM). The drawing on the left side of FIG. 15 is a cross-sectional view taken along line A—A of FIG. 18. FIG. 16 is a cross-sectional view taken along line B—B of FIG. 18. The drawing on the right side of FIG. 15 is a cross-sectional view of an analog capacitor forming area (Analog Capacitor). FIG. 17 is a cross-sectional view of a logic circuit forming area (Logic)

Next, the non-reacted metal films are removed by etching. Thereafter, the so-processed semiconductor substrate is subjected to heat treatment at temperatures ranging from 700° C. to 800° C. for about one minute to thereby bring each of the metal silicide layers 19 to a reduction in resistance.

Next, an insulating film formed of a silicon nitride film 20 is deposited over the semiconductor substrate 1 by the CVD method, for example. Incidentally, the silicon nitride film 20 acts as an etching stopper upon formation of each contact hole C1 to be described later.

Subsequently, for example, an insulating film comprising a silicon oxide film 21 is deposited over the silicon nitride film 20 (insulating film). The silicon oxide film 21 is formed by a plasma CVD method with tetraethoxy silane as a material, for example. Each of the silicon oxide film 21 and the silicon nitride film 20 results in an interlayer insulating film lying between each gate electrode G and a local wiring (local interconnect) L1 to be described later.

Figure 19:
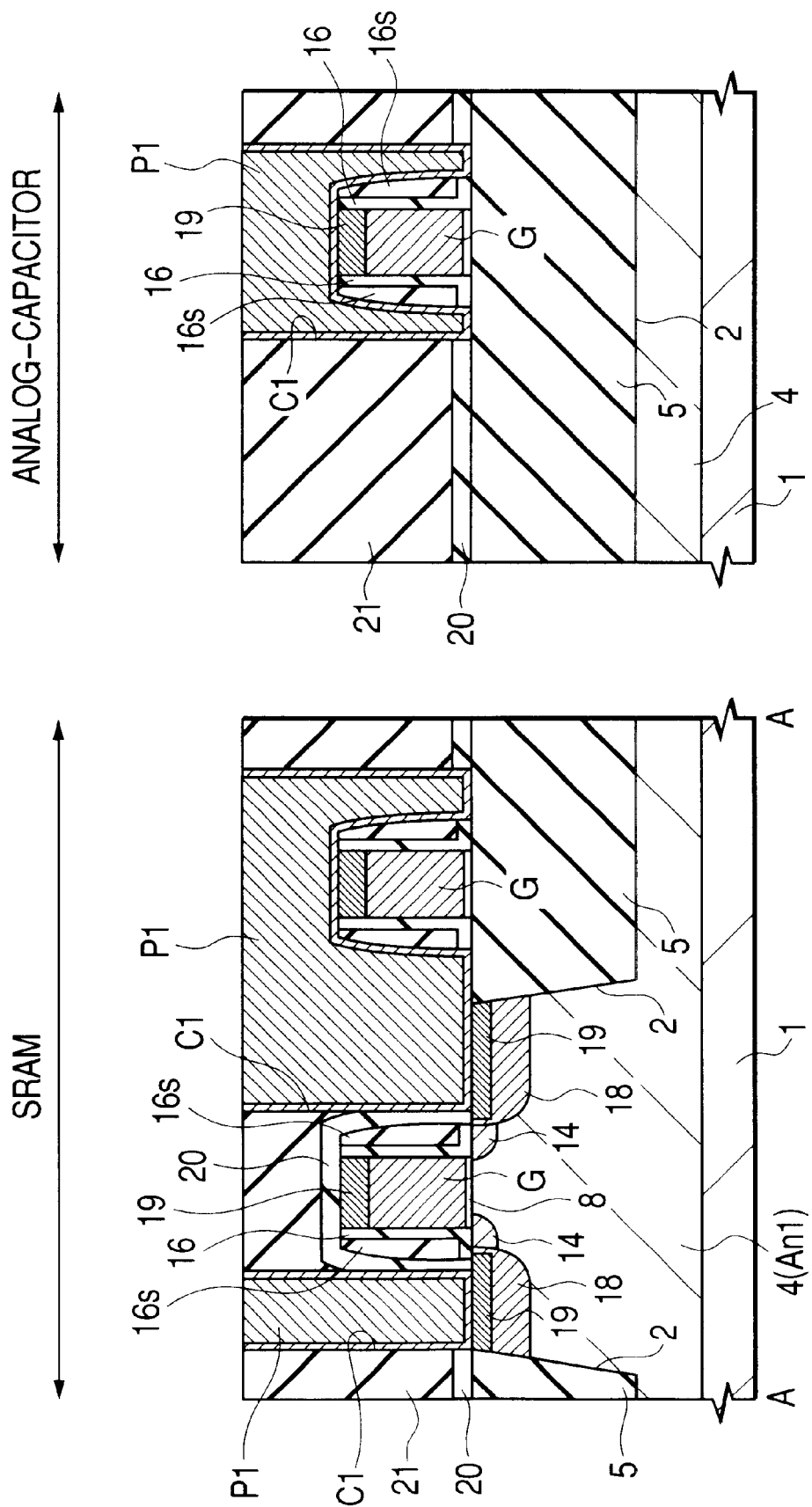
FIG. 19 is a fragmentary cross-sectional view of the substrate showing the method of manufacturing the semiconductor integrated circuit device illustrating the first embodiment of the present invention.
Figure 20:
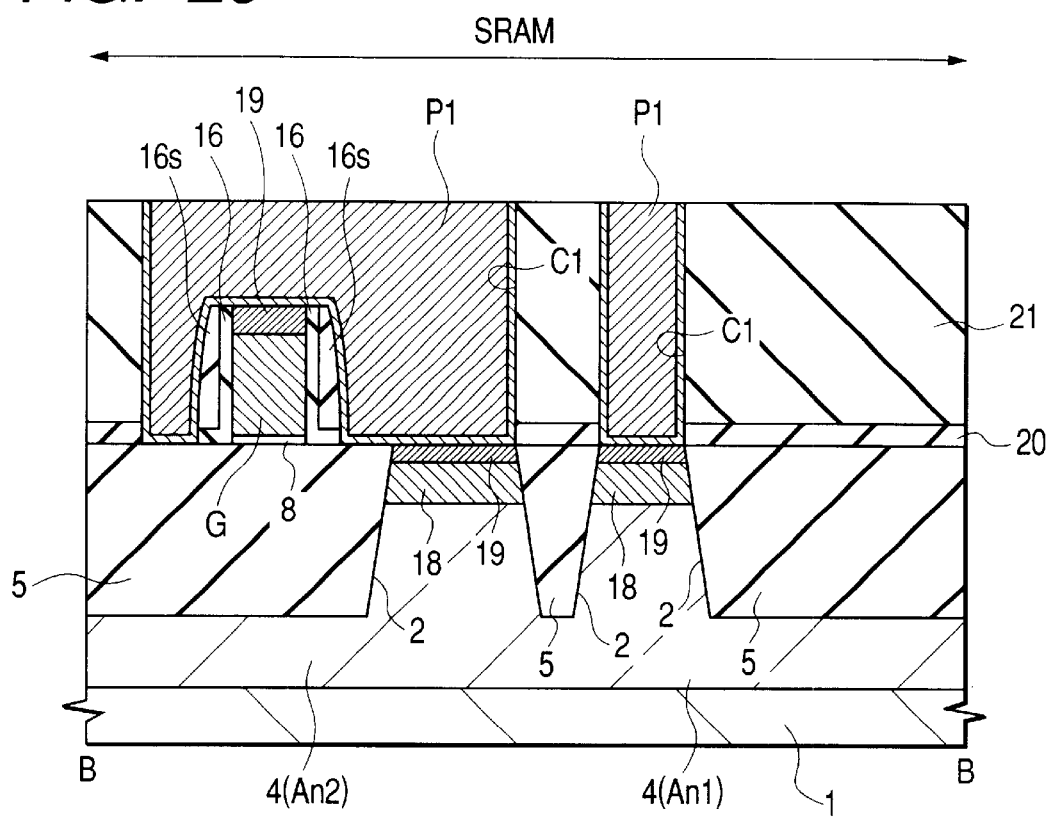
FIG. 20 is a fragmentary cross-sectional view of the substrate showing the method of manufacturing the semiconductor integrated circuit device illustrating the first embodiment of the present invention.
Figure 21:
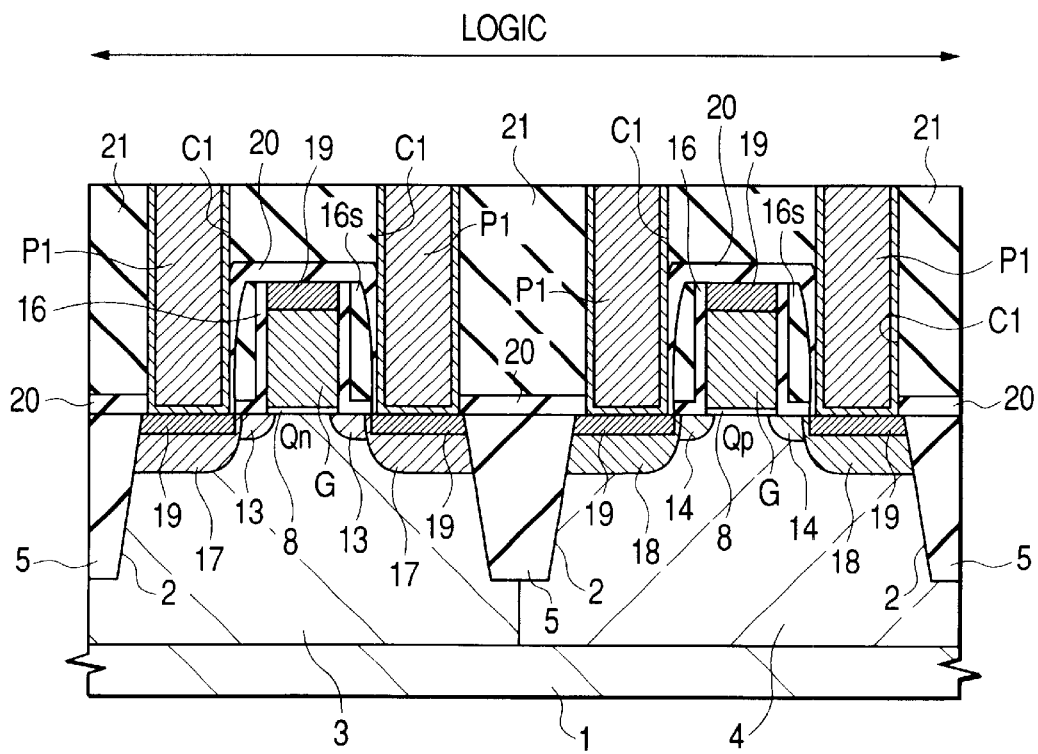
FIG. 21 is a fragmentary cross-sectional view of the substrate showing the method of manufacturing the semiconductor integrated circuit device illustrating the first embodiment of the present invention.
Figure 22:
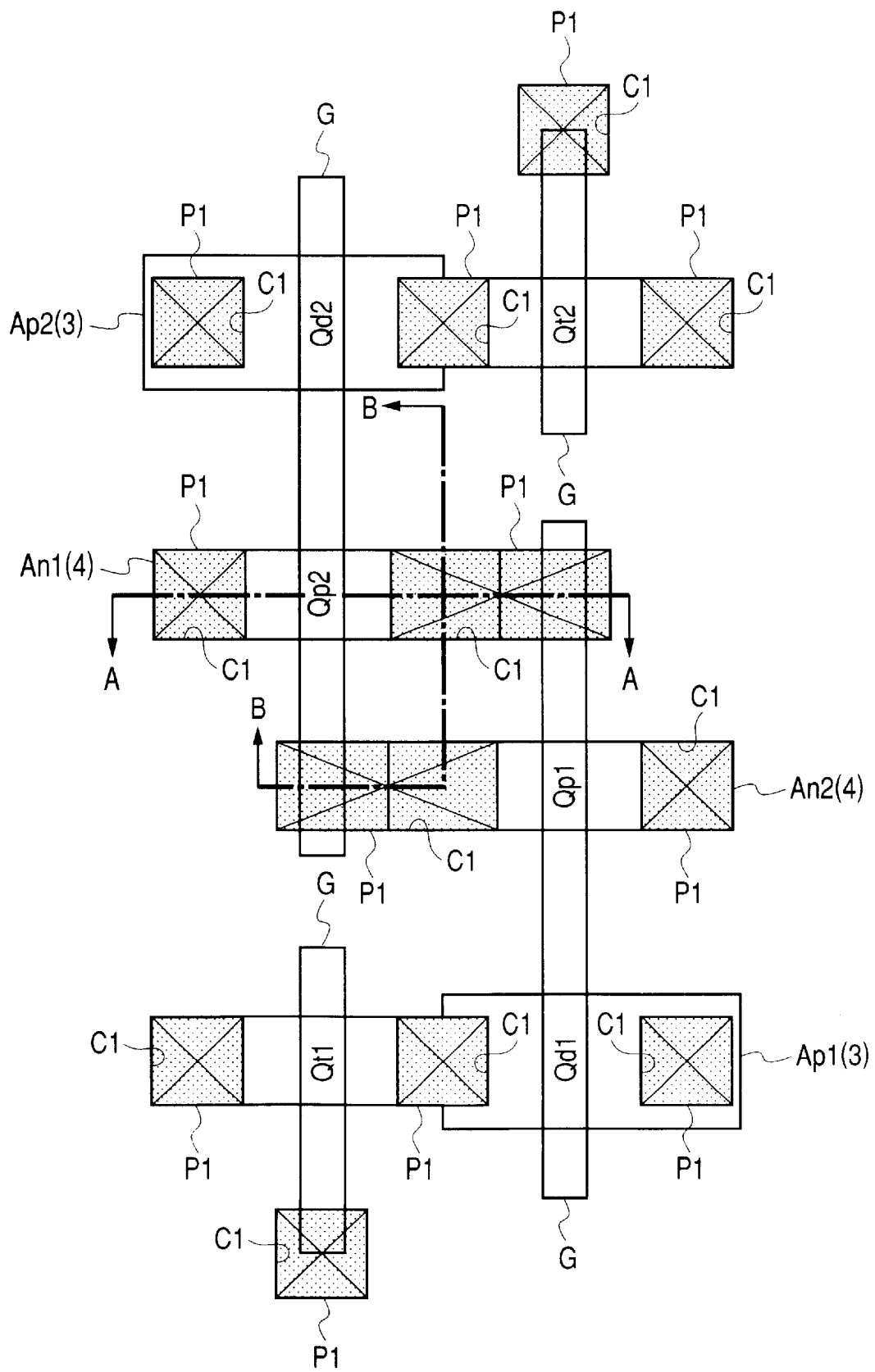
FIG. 22 is a fragmentary plan view of the substrate showing the method of manufacturing the semiconductor integrated circuit device illustrating the first embodiment of the present invention.

Next, as shown in FIGS. 19 through 22, the silicon oxide film 21 is dry-etched by dry-etching with, for example, a photoresist film (not shown) as a mask, followed by dry etching of the silicon nitride film 20, thereby forming contact holes C1. Now, FIG. 22 is a plan view of the semiconductor substrate showing the region corresponding to about one memory cell formed in its corresponding memory cell forming area (SRAM). The drawing on the left side of FIG. 19 is a cross-sectional view taken along line A—A of FIG. 22. FIG. 20 is a cross-sectional view taken along line B—B of FIG. 22. Further, the drawing on the right side of FIG. 19 is a cross-sectional view of an analog capacitor forming area (Analog Capacitor). FIG. 21 is a cross-sectional view of a logic circuit forming area (Logic).

Namely, contact holes C1 are defined over their corresponding $n^+$ type semiconductor regions 17 (source and drain) and $p^+$ type semiconductor regions 18 (source and drain) in the memory cell forming area (SRAM). Of these, the contact hole C1 on the drain of the load MISFET Qp1 extends to above the gate electrode of the load MISFET Qp2. The contact hole C1 on the drain of the load MISFET Qp2 extends to above the gate electrode of the load MISFET Qp1. Further, contact holes C1 are respectively defined over the gate electrodes G of the transfer MISFETs Qt1 and Qt2 (see FIG. 22, the left drawing of FIG. 19 and FIG. 20).

Further, contact holes C1 are defined over $n^+$ type semiconductor regions 17 (source and drain) and $p^+$ type semiconductor regions 18 (source and drain) in the logic circuit forming area (Logic) (see FIG. 21). A contact hole C1 is defined over its corresponding gate electrode G (wiring) in the analog capacitor forming area (Analog Capacitor (see the right drawing of FIG. 19).

Next, for example, a conductive film is embedded in the contact holes C1 to thereby form plugs (connecting portions) P1. In order to form the plugs P1, a thin barrier layer formed of, for example, a TiN film is first deposited over the silicon oxide film 21 including the interiors of the contact holes C1 by the sputtering method. Next, a conductive film comprising a W (tungsten) film is deposited thereon by the CVD method. Thereafter, it is etched back or subjected to CMP until the surface of the silicon oxide film 21 is exposed, to thereby remove the TiN film and W film lying outside the contact holes C1, whereby the plugs P1 are formed within the contact holes C1.

Next, as shown in FIGS. 23 through 26, an insulating film comprising a silicon oxide film 22 is deposited on the plugs P1 and the silicon oxide film 21 by the CVD method. Next, the silicon oxide film 22 is dry-etched by dry etching with a photoresist film (not shown) as a mask to thereby define wiring trenches HM0 on the plugs P1.

Figure 23:
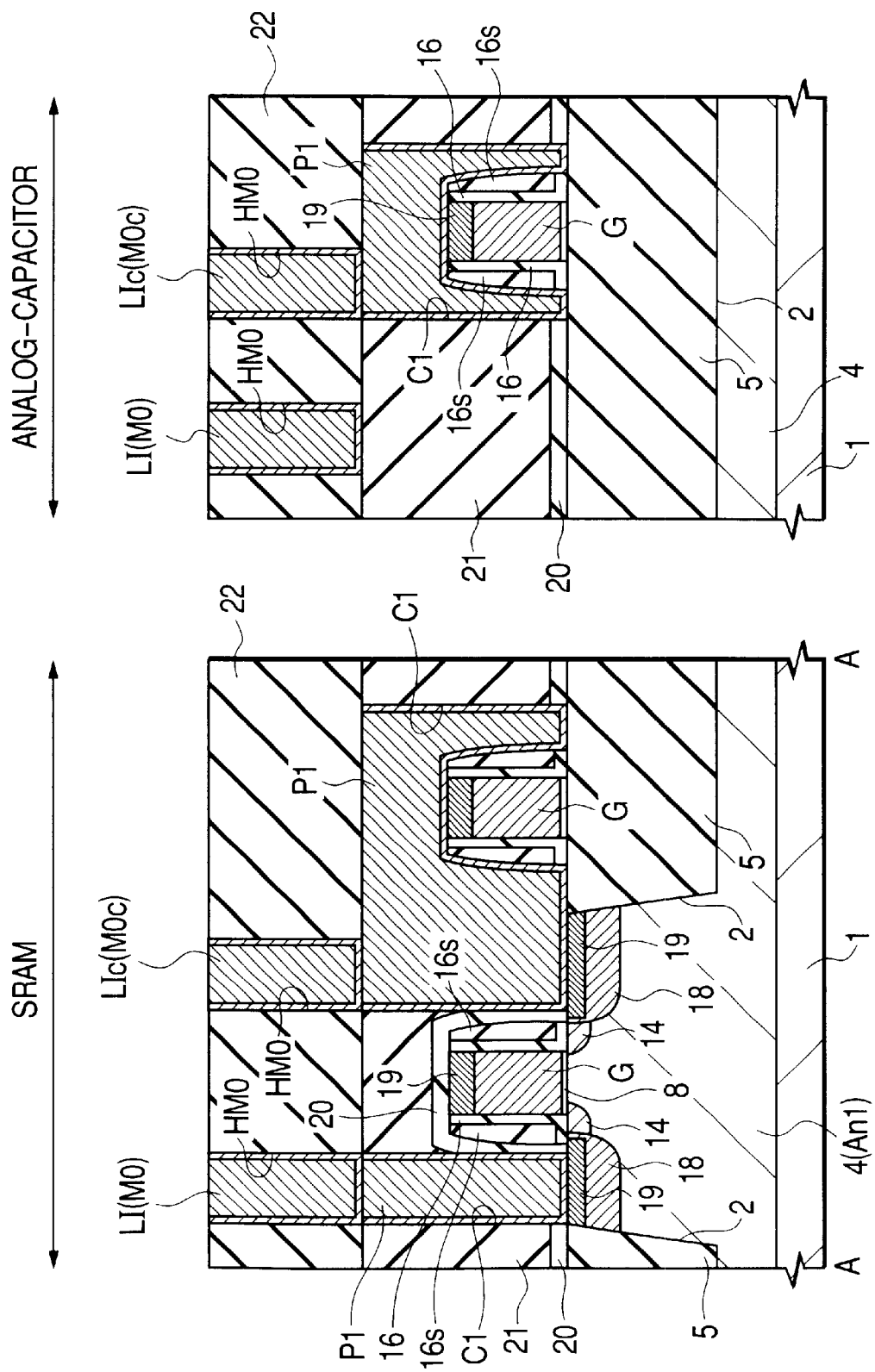
FIG. 23 is a fragmentary cross-sectional view of the substrate showing the method of manufacturing the semiconductor integrated circuit device illustrating the first embodiment of the present invention.
Figure 24:
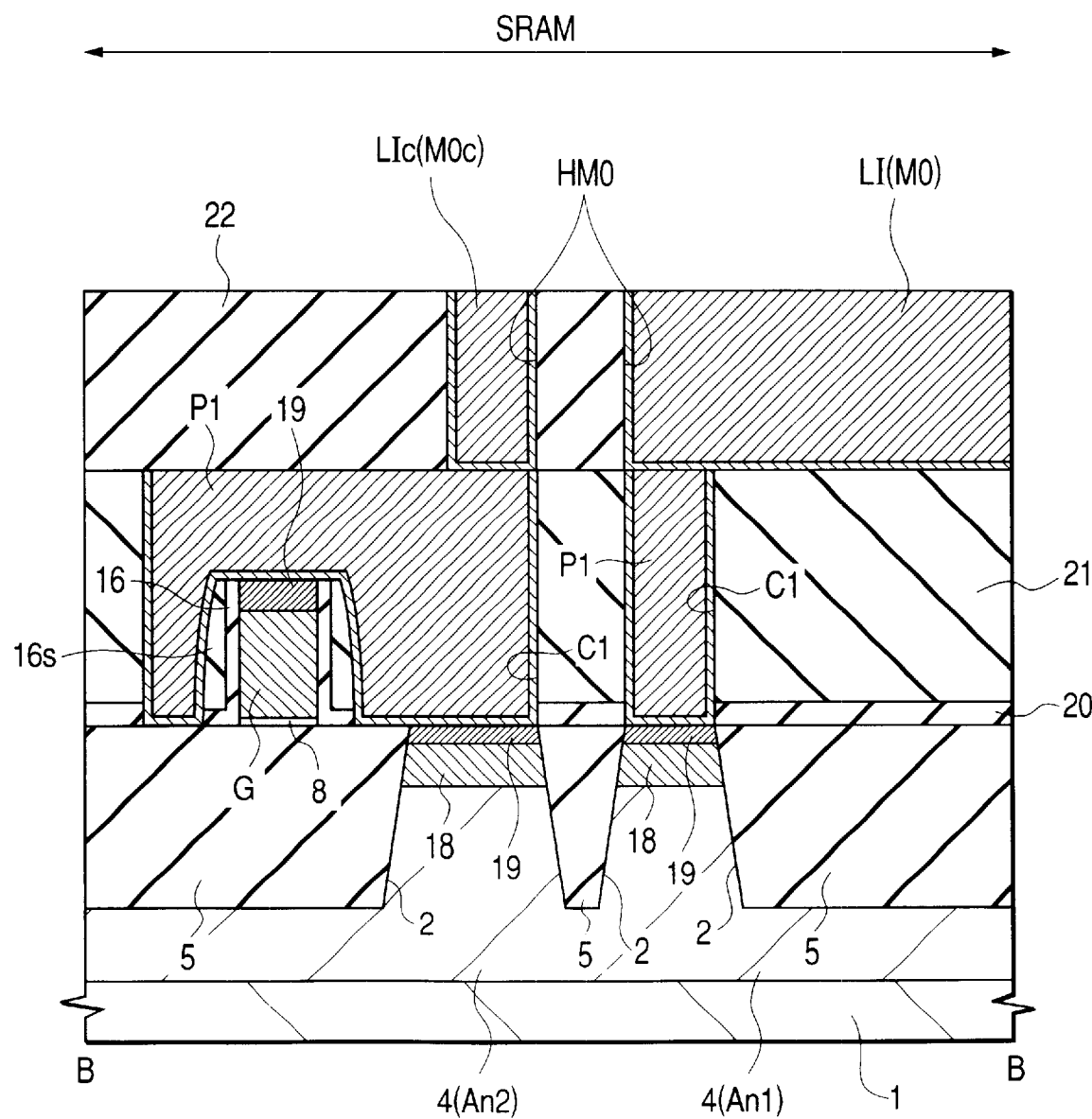
FIG. 24 is a fragmentary cross-sectional view of the substrate showing the method of manufacturing the semiconductor integrated circuit device illustrating the first embodiment of the present invention.
Figure 25:
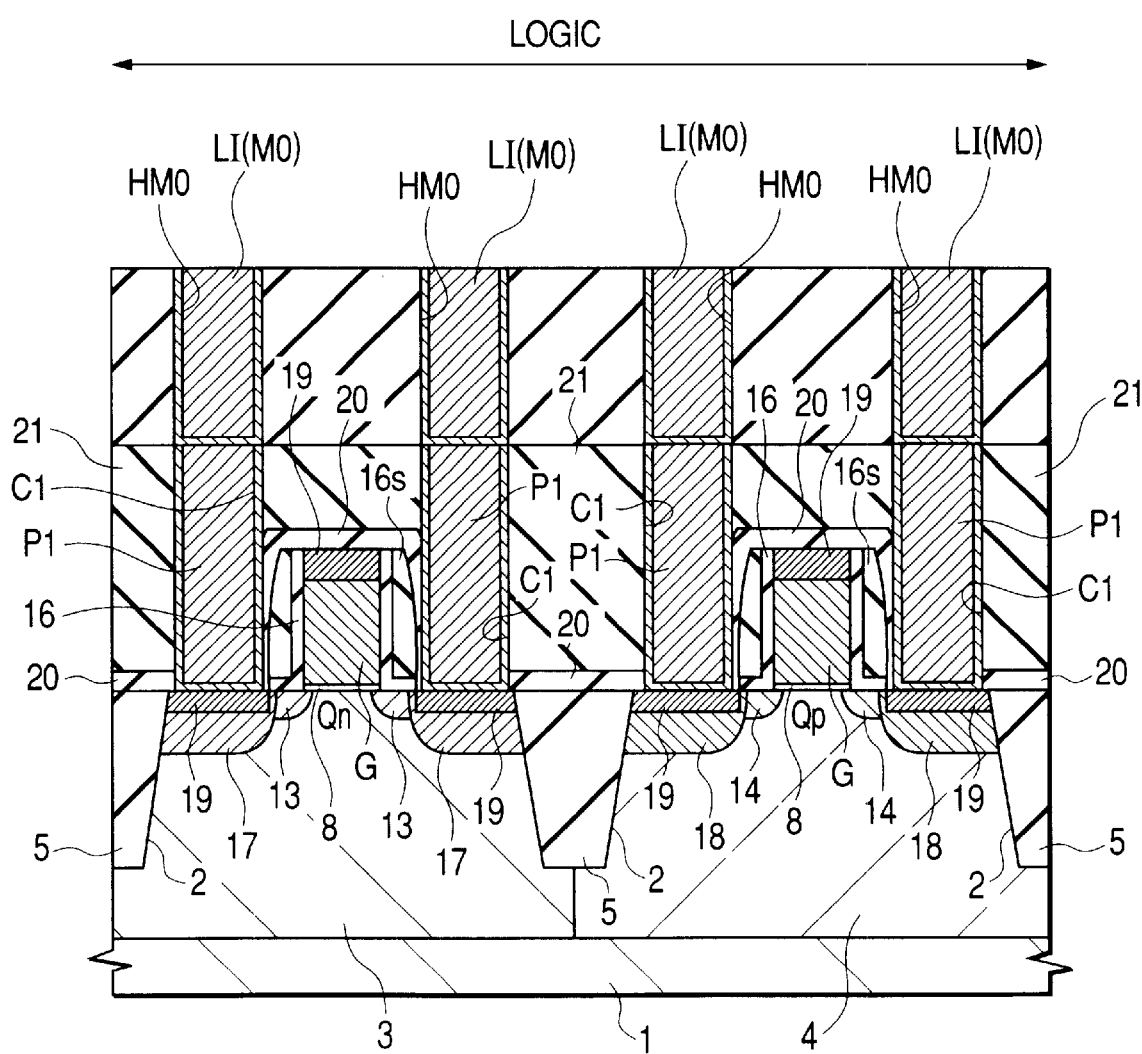
FIG. 25 is a fragmentary cross-sectional view of the substrate showing the method of manufacturing the semiconductor integrated circuit device illustrating the first embodiment of the present invention.
Figure 26:
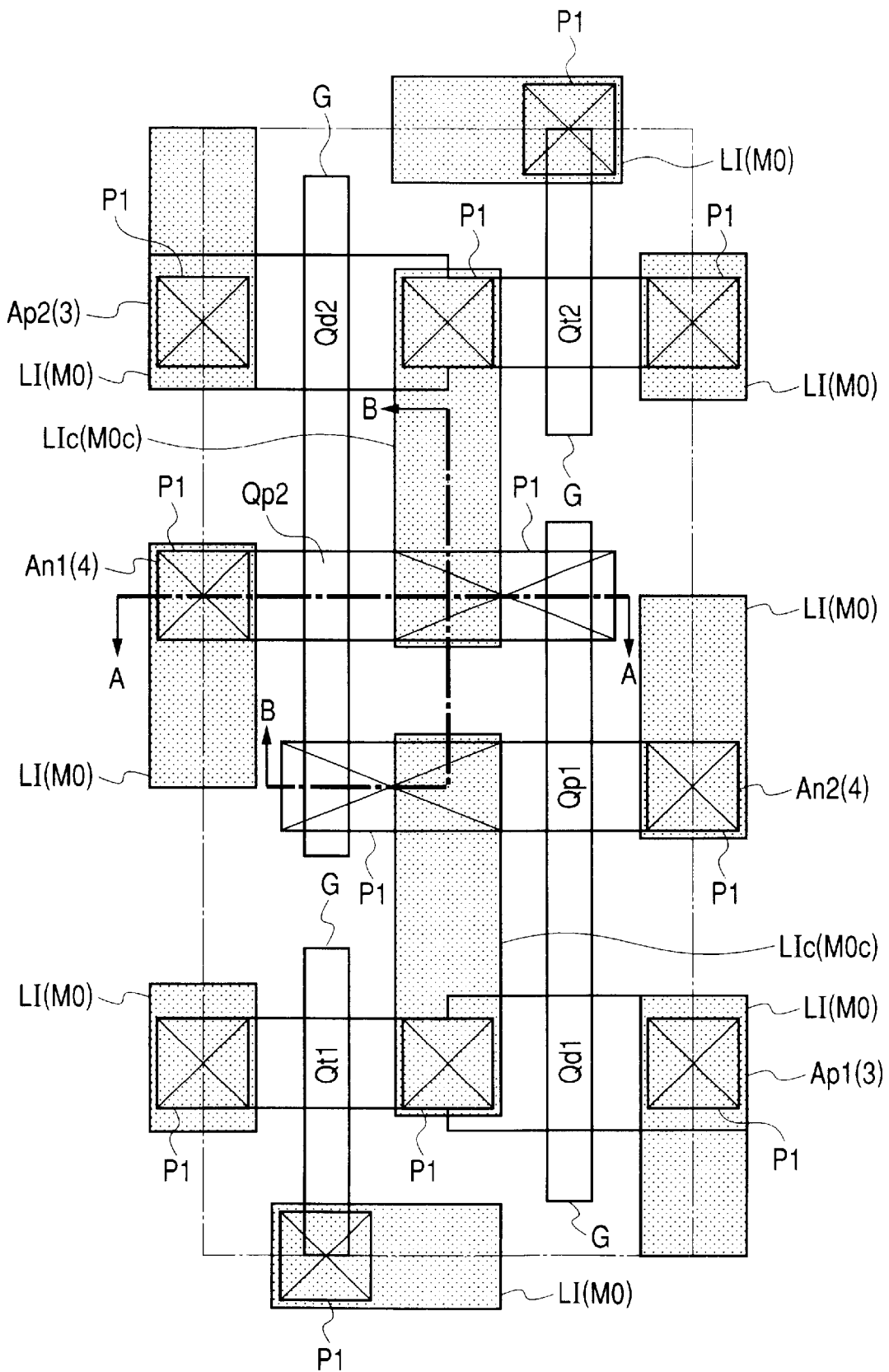
FIG. 26 is a fragmentary plan view of the substrate showing the method of manufacturing the semiconductor integrated circuit device illustrating the first embodiment of the present invention.

Now, FIG. 26 is a plan view of the semiconductor substrate showing the region corresponding to about one memory cell formed in its corresponding memory cell forming area (SRAM). The drawing on the left side of FIG. 23 is a cross-sectional view taken along line A—A of FIG. 26. FIG. 24 is a cross-sectional view taken along line B—B of FIG. 26. The drawing on the right side of FIG. 23 is a cross-sectional view of an analog capacitor forming area (Analog Capacitor). FIG. 25 is a cross-sectional view of a logic circuit forming area (Logic).

Namely, wiring trenches HM0 are defined on their corresponding plugs P1 on the $n^+$ type semiconductor regions 17 (source and drain) and p+ type semiconductor regions 18 (source and drain) in the memory cell forming area (SRAM).

Of these, the wiring trench HM0 on the plug P1 connected to the drain of the load MISFET Qp1 extends to above the plug P1 connected to the drain of the drive MISFET Qd1. The wiring trench HM0 on the plug P1 connected to the drain of the load MISFET Qp2 extends to above the plug P1 connected to the drain of the load MISFET Qd2 (see FIG. 26, the left drawing of FIG. 23 and FIG. 24). Local wirings LIc (M0c) formed within these wiring trenches HM0 respectively constitute lower electrodes having SPAM capacitance or capacitor $C_{SR}$ to be described later. Further, wiring trenches HM0 are defined on their corresponding plugs P1 on the gate electrodes G of the transfer MISFETs Qt1 and Qt2 (see FIG. 26).

Further, wiring trenches HM0 are defined on their corresponding plugs P1 on the n+ type semiconductor regions 17 (source and drain) and p+ type semiconductor regions 18 (source and drain) in the logic circuit forming area (Logic) (see FIG. 25). Further, wiring trenches HM0 are defined on their corresponding plugs P1 on the gate electrodes G (wirings) in the analog capacitor forming area (Analog Capacitor) (see the right drawing of FIG. 22). Each of local wirings LIc (M0c) formed within the wiring trenches HM0 on the plugs P1 constitutes a lower electrode having an analog capacitance or capacitor $C_{AN}$ to be described later.

Incidentally, the wiring trenches HM0 are defined even over the silicon oxide film 21 in the analog capacitor forming area (Analog Capacitor). Each of the wiring trenches is used to form a wiring for applying a desired potential to each of upper electrodes (24) each having an analog capacitance or capacitor $C_{AN}$ to be described later. Incidentally, a desired potential is applied to each lower electrode (LIc(M0c)) having the analog capacitor $C_{AN}$ via its corresponding gate electrode G (wiring).

Thus, according to the present embodiment, since the desired potential is applied to each upper electrode (24) of the analog capacitor $C_{AN}$ via a local wiring LI (M0) to be described later from its back or reverse side, no contact holes (plugs) are formed on the upper electrodes, and the upper electrodes at the formation of the contact holes (at etching) can be prevented from being damaged.

Next, a conductive film is embedded into the wiring trenches HM0 to thereby form local wirings (local interconnect) LI and LIc. Since the local wirings are wirings located below a first layer wiring to be described later, they might be called "M0". In order to form the local wirings (local interconnect) LI (M0) and LIc (M0c), a thin barrier layer formed of, for example, a TiN film is first deposited over its corresponding silicon oxide film 22 including the interior of each wiring trench HM0 by the sputtering method. Next, a conductive film formed of a W film is deposited thereon by the CVD method. Afterwards, it is etched back or subjected to CMP until the surface of the silicon oxide film 22 is exposed, to thereby remove the TiN film and W film lying outside the wiring trenches HM0, whereby the local wirings are formed.

Thus, according to the present embodiment, the conductive films (TiN film and W film) are embedded into the wiring trenches HM0 to form the local wirings LI (M0) and LIc (M0c). Therefore, their upper portions are flattened, and a capacitive insulating film and upper electrodes formed thereover can be formed with satisfactory accuracy. For instance, a variation in capacitance between adjacent capacitors can be set to less than or equal to 3%, and a total variation can be set to 20% or less.

According to this process step, the drain of the load MISFET Qp1, the drain of the drive MISFET Qd1, and the gate electrode of the load MISFET Qp2 are connected via the local wiring LIc (M0c) and the plug P1 in the memory cell forming area (SRAM). Further, the drain of the load MISFET Qp2, the drain of the drive MISFET Qd2 and the gate electrode of the load MISFET Qp1 are connected via the local wiring LIc (M0c) and the plug P1.

A plurality of memory cells are repeatedly formed lengthwise and crosswise in a memory cell array of the SRAM. A broken line in FIG. 26 indicates a unit area for a memory cell. For example, a plurality of memory cells are formed linearly symmetrical with the long and short sides of such a rectangular area.

Next, as shown in FIGS. 27 through 30, for example, a silicon nitride film 23 is formed over the silicon oxide film 22 and the local wirings LI (M0) and LIc (M0c). The silicon nitride film 23 is formed between the local wiring LIc (M0c) and each upper electrode 24 to be described later and used as a capacitive insulating film. The thickness of the silicon nitride film 23 (capacitive insulating film) is set to about 10 nm when, for example, the area (unit area) corresponding to one memory cell is 2.0 $\mu m^2$, and the area for forming one local wiring LIc (M0c) referred to above is 0.17 $\mu m^2$.

Figure 27:
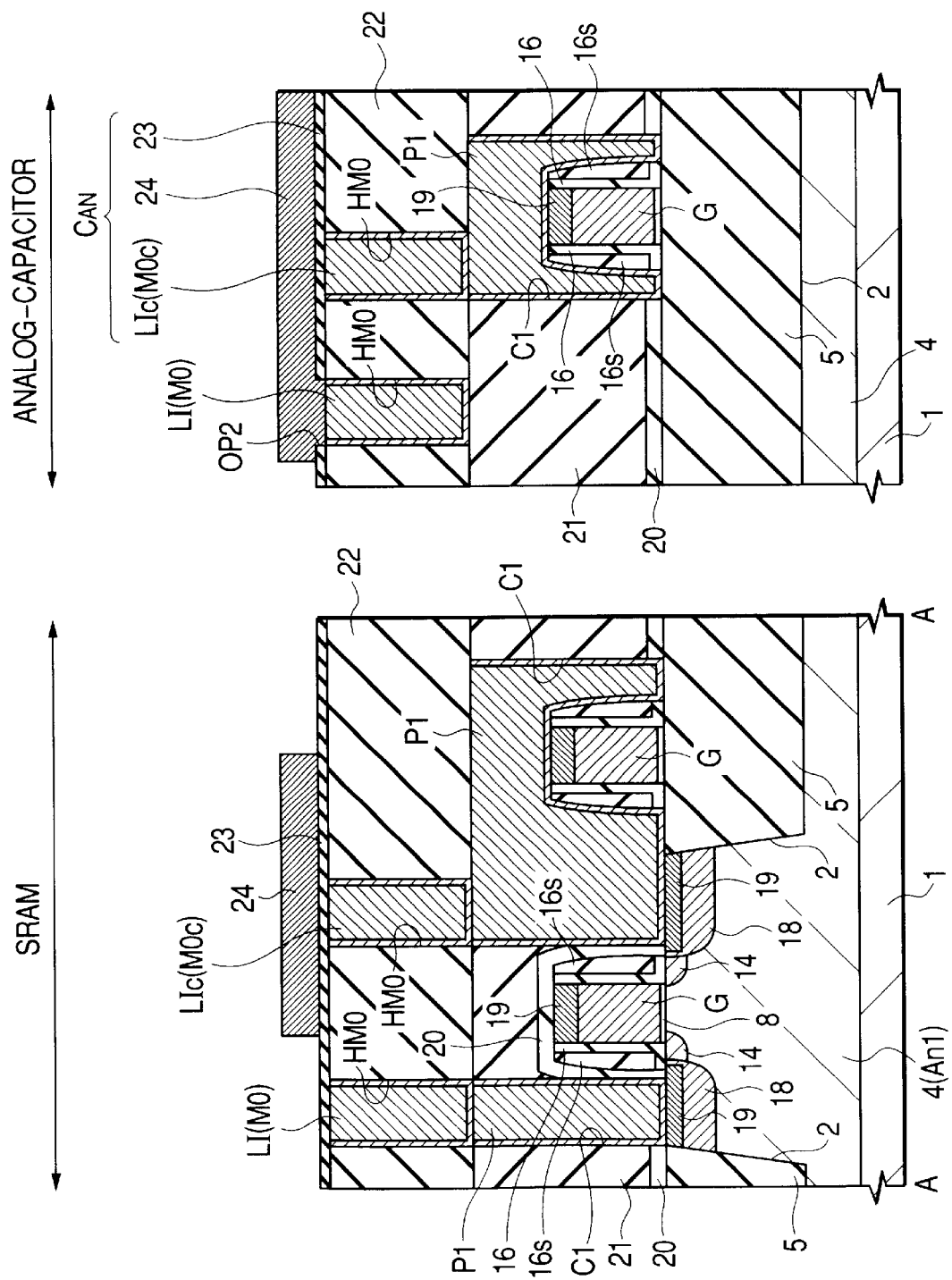
FIG. 27 is a fragmentary cross-sectional view of the substrate showing the method of manufacturing the semiconductor integrated circuit device illustrating the first embodiment of the present invention.
Figure 28:
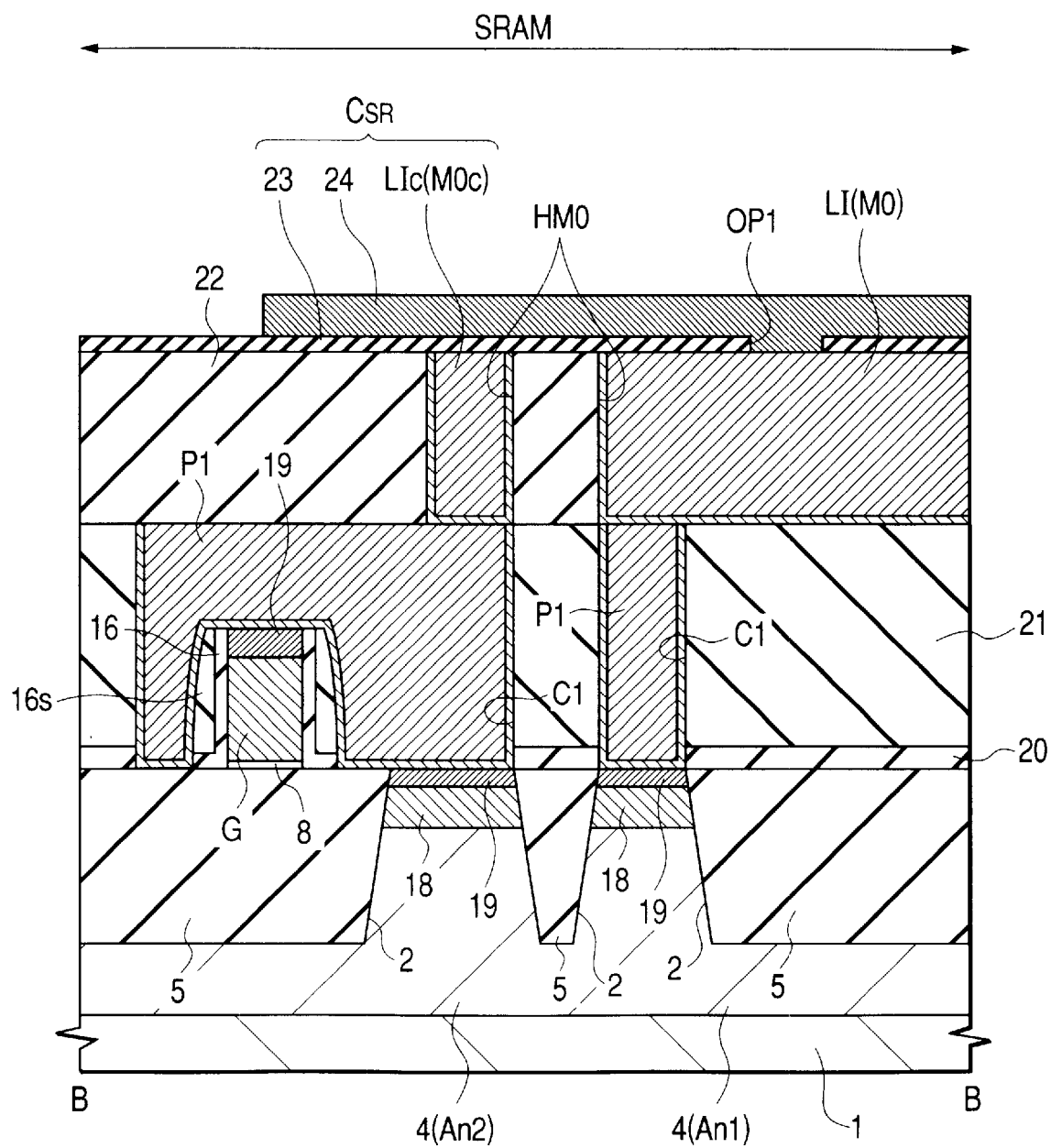
FIG. 28 is a fragmentary cross-sectional view of the substrate showing the method of manufacturing the semiconductor integrated circuit device illustrating the first embodiment of the present invention.
Figure 29:
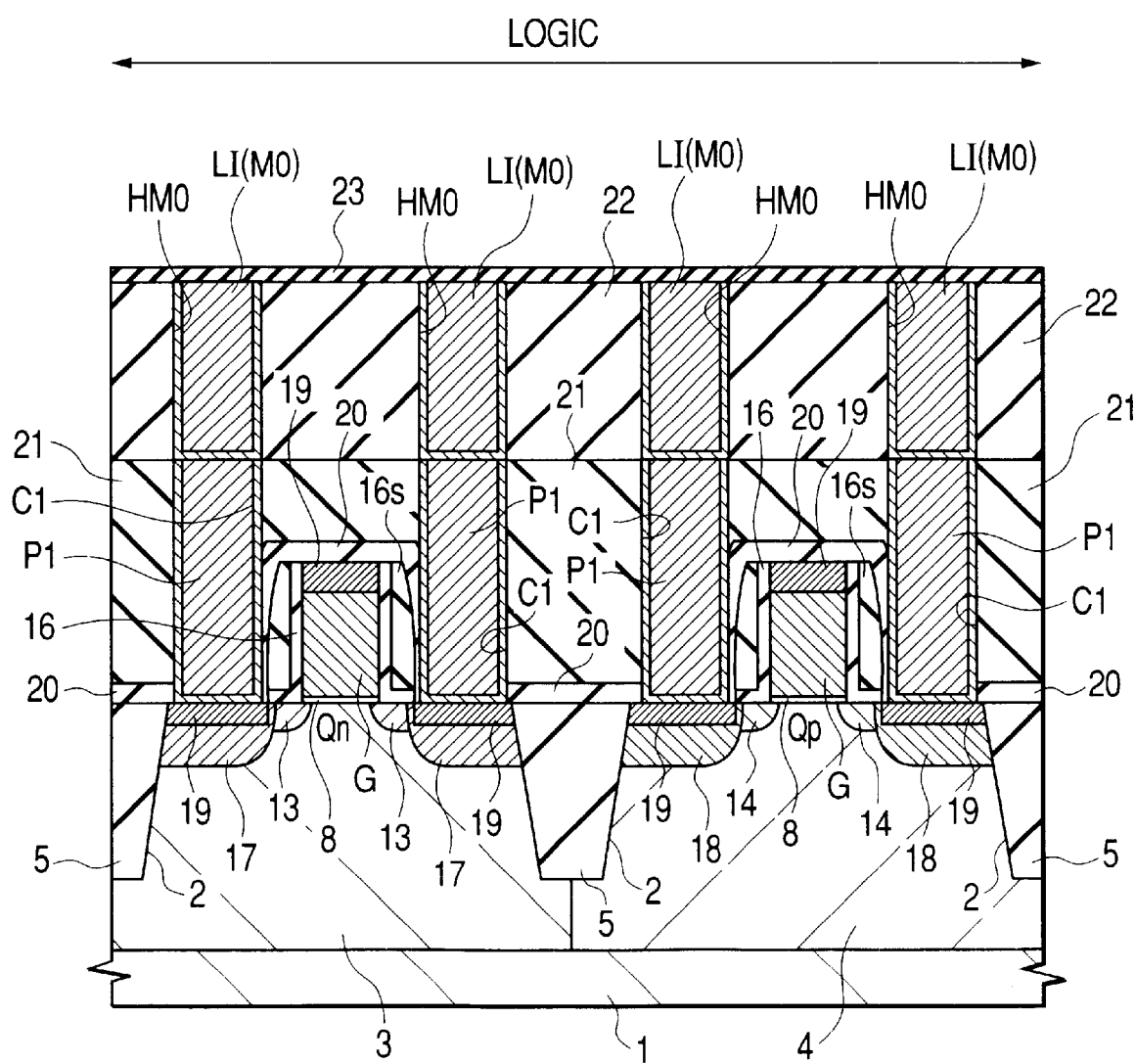
FIG. 29 is a fragmentary cross-sectional view of the substrate showing the method of manufacturing the semiconductor integrated circuit device illustrating the first embodiment of the present invention.
Figure 30:
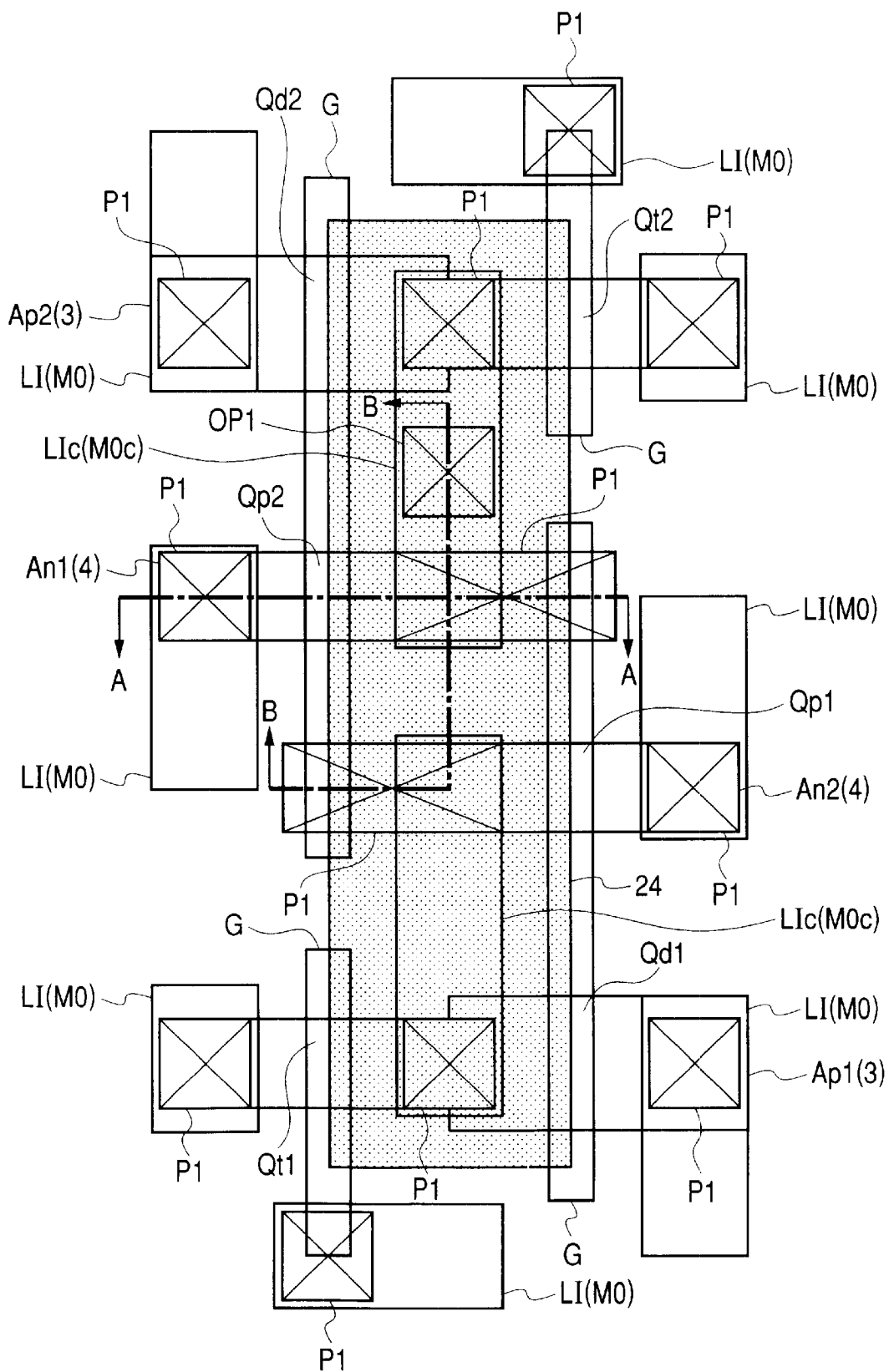
FIG. 30 is a fragmentary plan view of the substrate showing the method of manufacturing the semiconductor integrated circuit device illustrating the first embodiment of the present invention.

Now, FIG. 30 is a plan view of the semiconductor substrate showing the region corresponding to about one memory cell formed in its corresponding memory cell forming area (SRAM). The drawing on the left side of FIG. 27 is a cross-sectional view taken along line A—A of FIG. 30. FIG. 28 is a cross-sectional view taken along line B—B of FIG. 30. The drawing on the right side of FIG. 27 is a cross-sectional view of an analog capacitor forming area (Analog Capacitor), and FIG. 29 is a cross-sectional view of a logic circuit forming area (Logic).

Next, the silicon nitride film 23 lying on any one of the local wirings LIc (M0c) that constitute the two capacitances or capacitors formed in the memory cell forming area (SRAM) is removed to define an opening OP1 (see FIGS. 30 an 28). Further, the silicon nitride film 23 on its corresponding local wiring LI (M0) formed in the analog capacitor forming area (Analog Capacitor) is removed to define an opening OP2 (see FIG. 27).

Next, a conductive film like a TiN film or a W film is deposited on the silicon nitride film 23 including the openings OP1 and OP2 by the sputtering method and subjected to patterning to thereby form the upper electrode 24 on the local wirings LIc (M0c).

Now, the upper electrode 24 in the memory cell forming area (SRAM) is formed so as to cover the two local wirings LIc (M0c). Further, the upper electrode 24 is connected to its corresponding local wiring LIc (M0c) via the opening OP1 (see FIG. 30, the left drawing of FIG. 27 and FIG. 28). Similarly, the upper electrode 24 in the analog capacitor forming area (Analog Capacitor) is formed so as to cover the local wiring LIc (M0c) that constitutes each capacitance or capacitor. Further, the present upper electrode 24 is connected to its corresponding local wiring LI (M0) via the opening OP2 (see the left drawing of FIG. 27).

Thus, according to the present embodiment, since the upper electrode 24 is patterned so as to cover its corresponding local wiring LIc (M0c), the capacitive insulating film 23 on the local wiring LIc (M0c), i.e., the capacitive insulating film that contributes to the capacitor, is not etched upon formation of the upper electrode 24 (upon etching of W film), and a leak current can be prevented from occurring in the end of the capacitor. Further, the end of each local wiring LIc referred to above is formed over the plug (connecting portion) P1.

Figure 45:
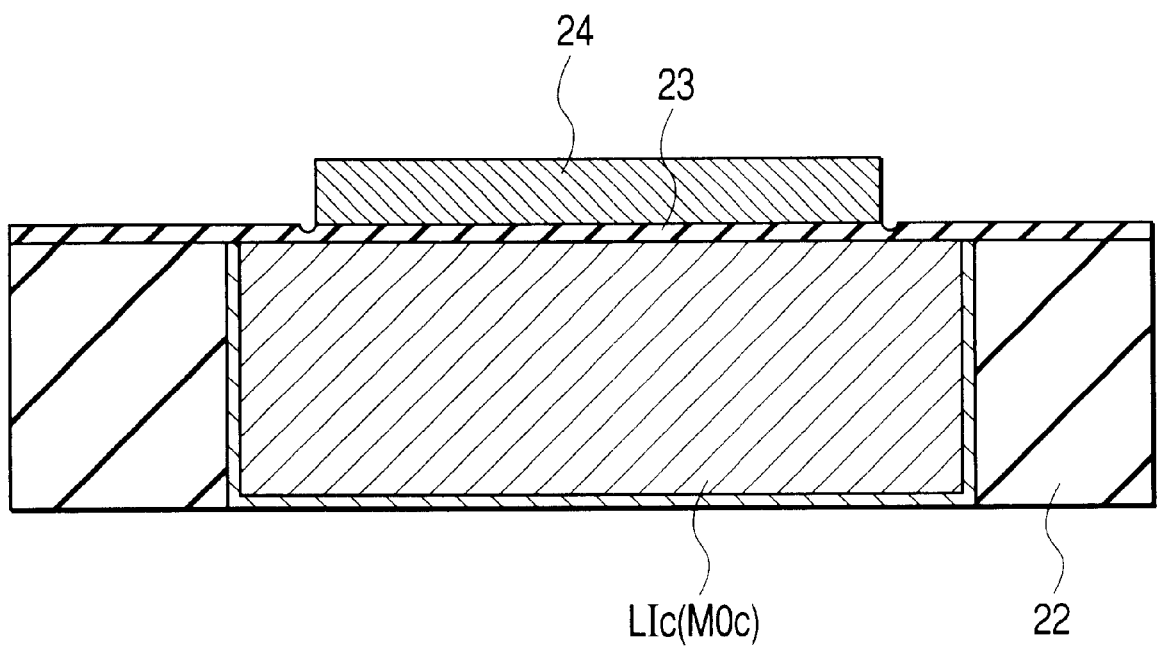
FIG. 45 is a view for describing the effects of the first embodiment of the present invention.

When portions of a local wiring LIc (M0c) uncovered with its corresponding upper electrode 24 exist as shown in FIG. 45 by way of example, a capacitive insulating film 23 is damaged at the end of the upper electrode 24 upon formation of the upper electrode 24 (upon etching of W film). When it is over-etched, the thickness thereof is reduced. As a result, pin holes occur in the capacitive insulating film and hence a leak current will increase. On the other hand, since the capacitive insulating film that contributes to the capacitor, is not etched in the present embodiment, the leak current can be prevented from flowing.

Since the difference in etching rate is small between the silicon nitride film and the TiN film in particular, a selection ratio is hard to be taken. They are so effective for application to the case where the TiN film is used for the upper electrode 24 and the silicon nitride film is used for the capacitive insulating film 23.

According to the above process steps, an SRAM capacitor $C_{SR}$, which comprises the local wiring LIc (M0c), the silicon nitride film 23 and the upper electrode 24, can be formed in the memory cell forming area (SRAM). Further, an analog capacitor $C_{AN}$, which comprises the local wiring LIc (M0c), silicon nitride film 23 and upper electrode 24, can be formed in the analog capacitor forming area (Analog capacitor).

Thus, according to the present embodiment, since the SRAM capacitor $C_{SR}$ is formed between the storage nodes (on the local wiring) of the SRAM formed in the memory cell forming area, a soft error produced due to an α ray launched into each memory cell of the SRAM can be reduced.

According to the present embodiment as well, the SRAM capacitor $C_{SR}$ and the analog capacitor $C_{AN}$ can be formed in the same process step.

Since, at this time, each local wiring LIc (M0c) used as the lower electrode is flattened as described above, variations in capacitance of the SRAM capacitor $C_{SR}$ and the analog capacitor $C_{AN}$ can be reduced. The variation in capacitance between the adjacent capacitors, which is less than or equal to 3%, and the total variation of 20% or less, both of which are required for the analog capacitor $C_{AN}$, can be achieved.

Further, since the lower electrodes (local wirings) and upper electrodes for the SRAM capacitor $C_{SR}$ and analog capacitor $C_{AN}$ are formed of the metal film such as the W film or the metal compound film having conductivity such as the TiN film or the like (so-called MIM (Metal Insulator Metal) structure) in the present embodiment, capacitive characteristics can be enhanced. Since a depletion layer is formed within polysilicon when the polysilicon is used as an electrode material for these, voltage dependence will occur. As compared with it, the MIM structure is capable of suppressing the voltage dependence.

Since the analog capacitor $C_{AN}$ is formed over the silicon oxide film 21, it is less subject to a substrate potential and a voltage characteristic of the capacitor can be enhanced.

Since the thickness of the capacitive insulating film can be set regardless of the thickness of the gate insulating film, it is possible to prevent the occurrence of a leak current due to a tunnel current. Incidentally, since the tunnel current exceeds $1 \times 10^{-4} A/cm^2$ when the thickness of the insulating film is less than 2.6 nm, it is necessary to set the thickness of the capacitive insulating film to 2.6 nm or more.

Afterwards, a first layer wiring M1 and a second layer wiring M2 are formed on the upper electrode 24 with an interlayer insulating film (silicon oxide film 25) interposed therebetween. A process for forming these wirings will be described subsequently.

Figure 31:
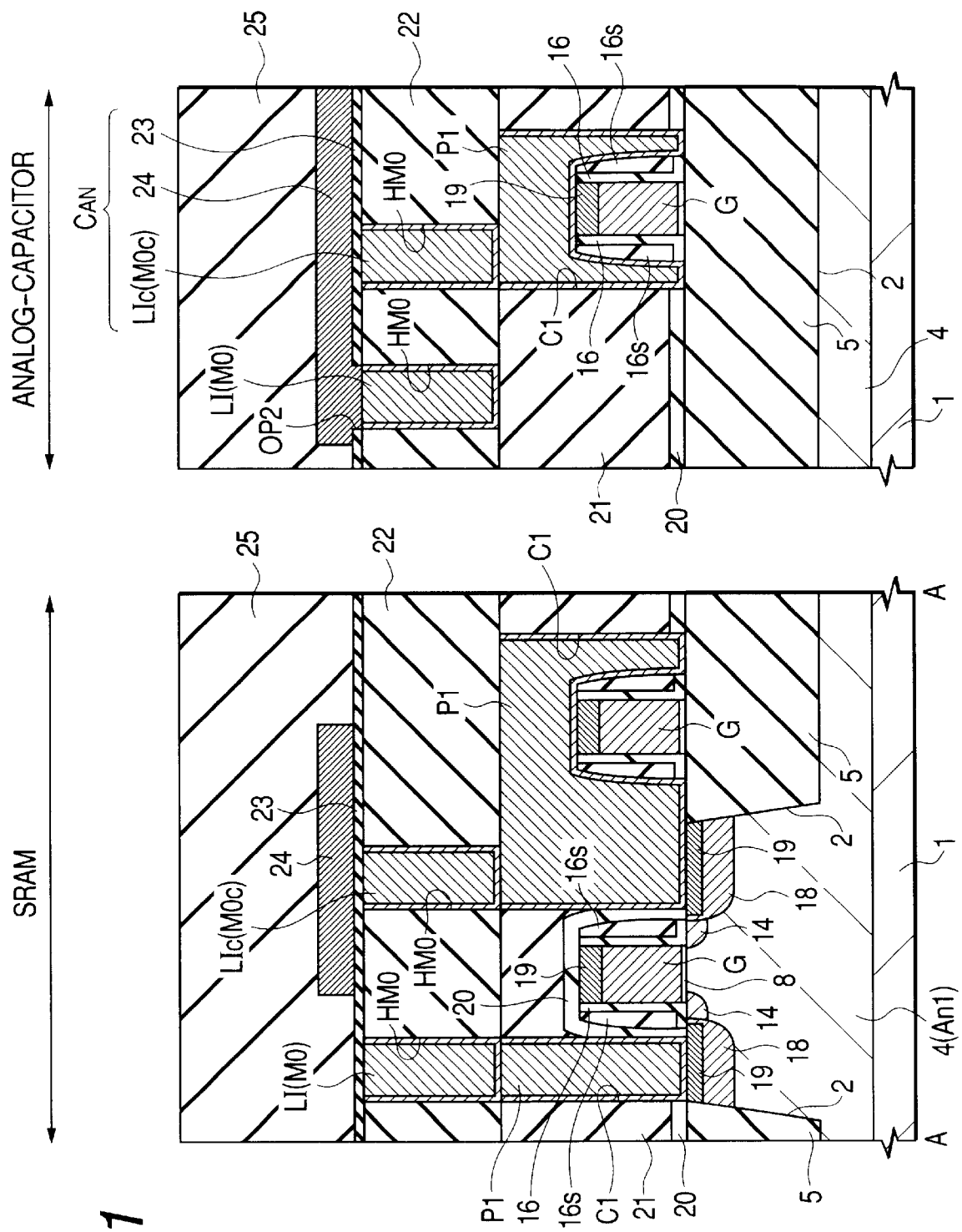
FIG. 31 is a fragmentary cross-sectional view of the substrate showing the method of manufacturing the semiconductor integrated circuit device illustrating the first embodiment of the present invention.
Figure 32:
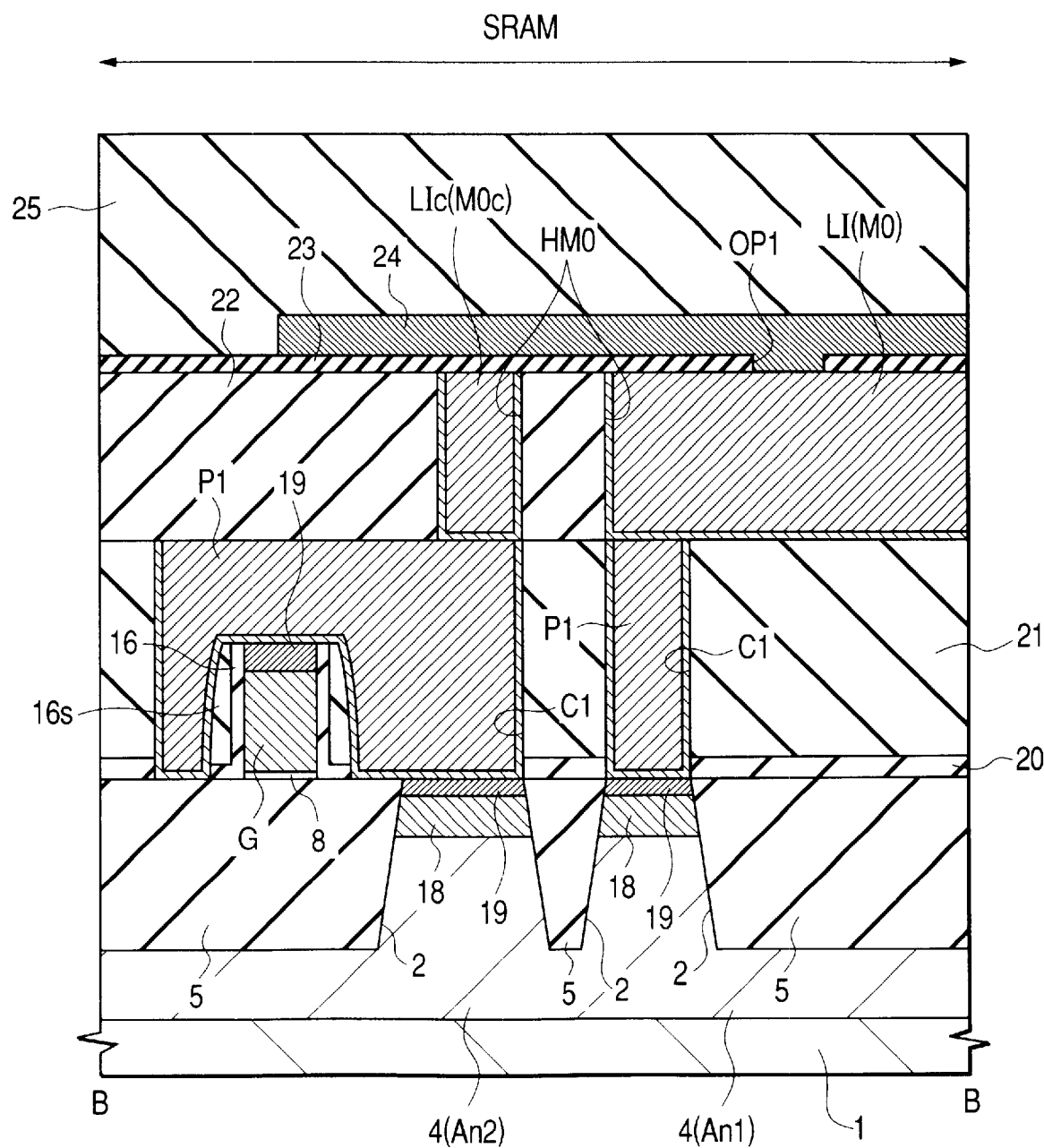
FIG. 32 is a fragmentary cross-sectional view of the substrate showing the method of manufacturing the semiconductor integrated circuit device illustrating the first embodiment of the present invention.
Figure 33:
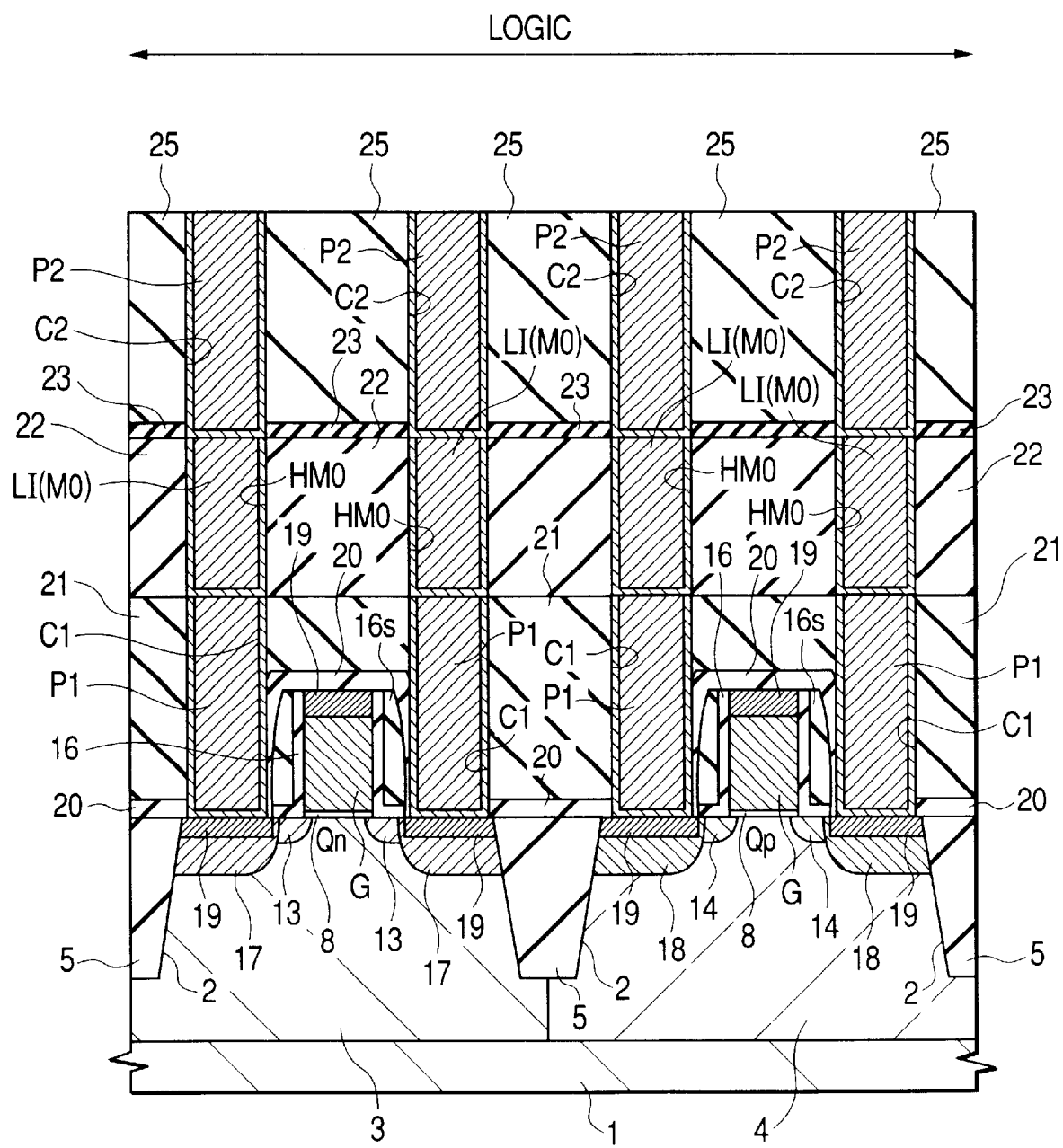
FIG. 33 is a fragmentary cross-sectional view of the substrate showing the method of manufacturing the semiconductor integrated circuit device illustrating the first embodiment of the present invention.
Figure 34:
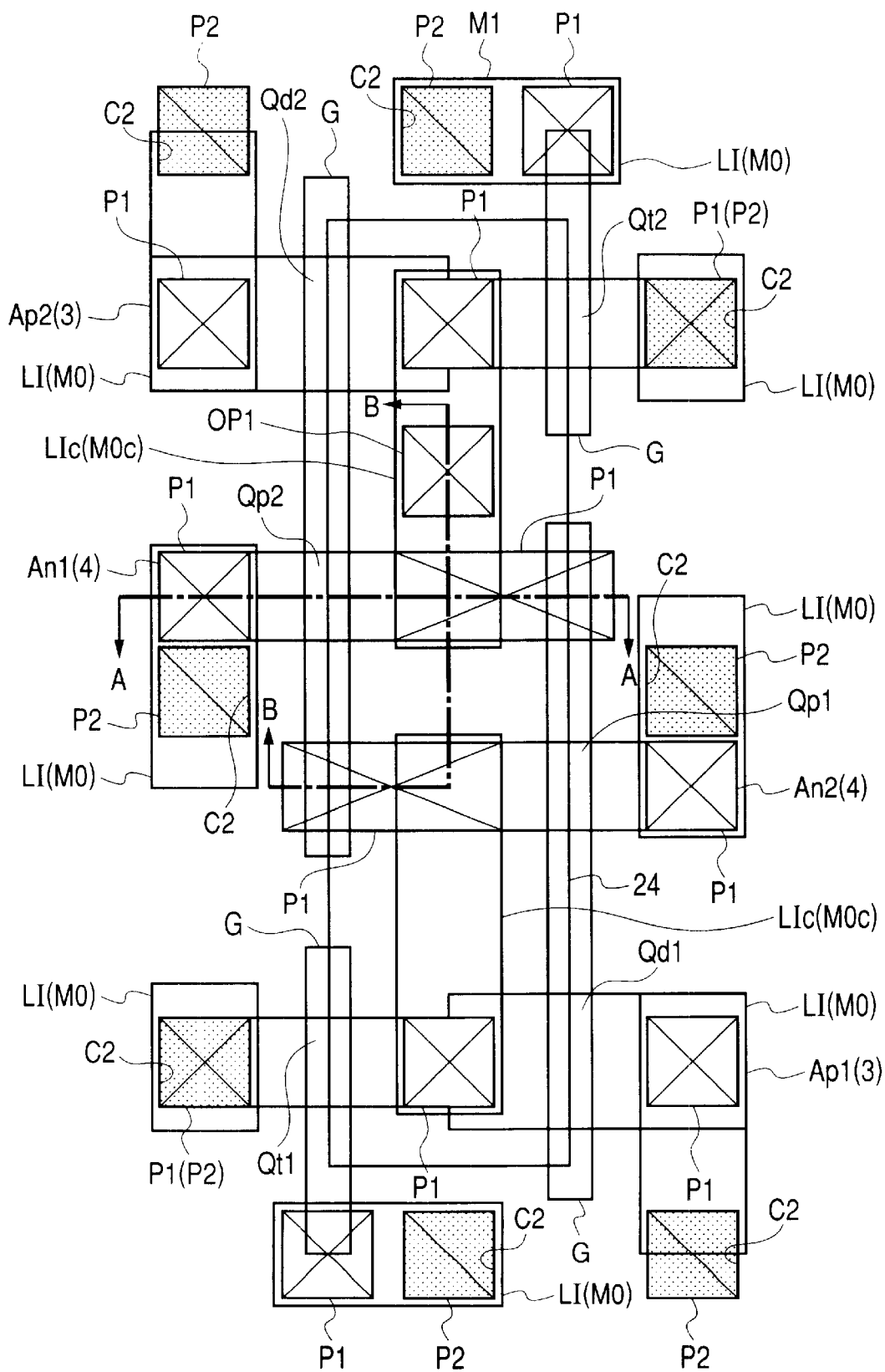
FIG. 34 is a fragmentary plan view of the substrate showing the method of manufacturing the semiconductor integrated circuit device illustrating the first embodiment of the present invention.

As shown in FIGS. 31 through 34, the silicon oxide film 25 is first deposited over each upper electrode 24 and the silicon nitride film 23 by the CVD method. Next, the silicon oxide film 25 and the silicon nitride film 23 on the local wirings LI (M0) and LIc (M0c) are removed by etching to thereby define contact holes C2. Now, FIG. 34 is a plan view of the semiconductor substrate showing the region corresponding to about one memory cell formed in the memory cell forming area (SRAM). The drawing on the left side of FIG. 31 is a cross-sectional view taken alone line A—A of FIG. 34. FIG. 32 is a cross-sectional view taken along line B—B of FIG. 34. The drawing on the right side of FIG. 31 is a cross-sectional view of an analog capacitor forming area (Analog Capacitor). FIG. 33 is a cross-sectional view of a logic circuit forming area (Logic).

Namely, the contact holes C2 are formed on the local wirings LI (M0) and LIc (M0c) (see FIG. 34) in the memory cell forming area (SPAM). Of these, the contact holes C2 on the local wirings LI (M0) connected to the gate electrodes G of the transfer MISFETs Qt1 and Qt2 are used for connection between the first layer wiring M1 (word line WL) and the gate electrodes G.

A contact hole C2 is defined on its corresponding local wiring LI (M0) and an area not shown in the cross-section illustrated in FIG. 31 in the analog capacitor forming area (Analog Capacitor). The contact hole C2 is used to apply a desired potential to its corresponding upper electrode 24 for the analog capacitor $C_{AN}$ via the local wiring LI (M0).

Further, contact holes C2 are defined on the local wirings LI (M0) in the logic circuit forming area (Logic)(see FIG. 33).

Next, a conductive film is embedded inside the contact holes C2 to form plugs P2. In order to form the plugs P2, a thin barrier layer comprising, for example, a TiN film is first deposited over the silicon oxide film 25 including the interiors of the contact holes C2 by the sputtering method. Next, a conductive film formed of, for example, a W film is deposited thereon by the CVD method. Thereafter, it is etched back or subjected to CMP until the surface of the silicon oxide film 25 is exposed, thereby removing the TiN and W films lying outside the contact holes C2.

Figure 35:
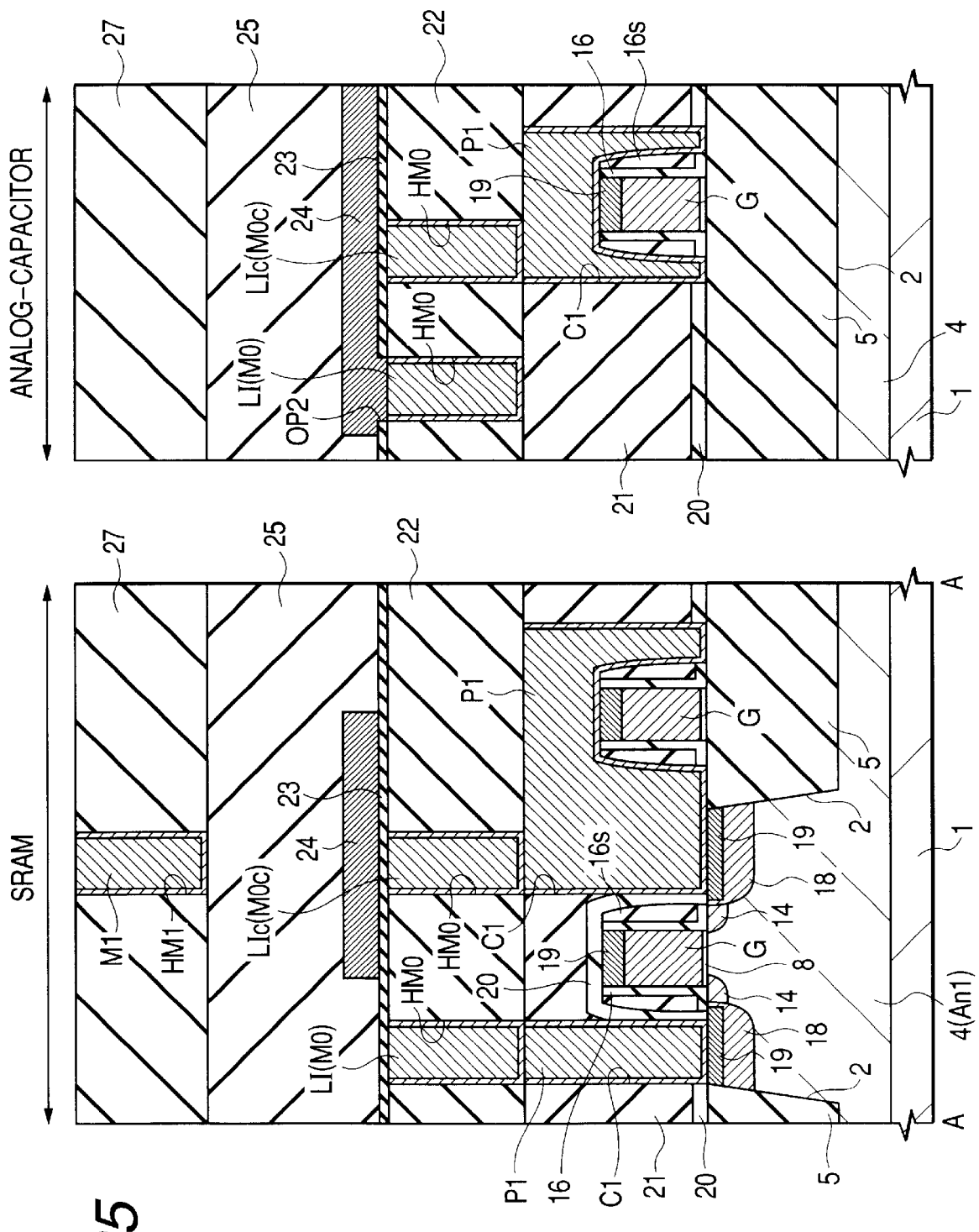
FIG. 35 is a fragmentary cross-sectional view of the substrate showing the method of manufacturing the semiconductor integrated circuit device illustrating the first embodiment of the present invention.
Figure 36:
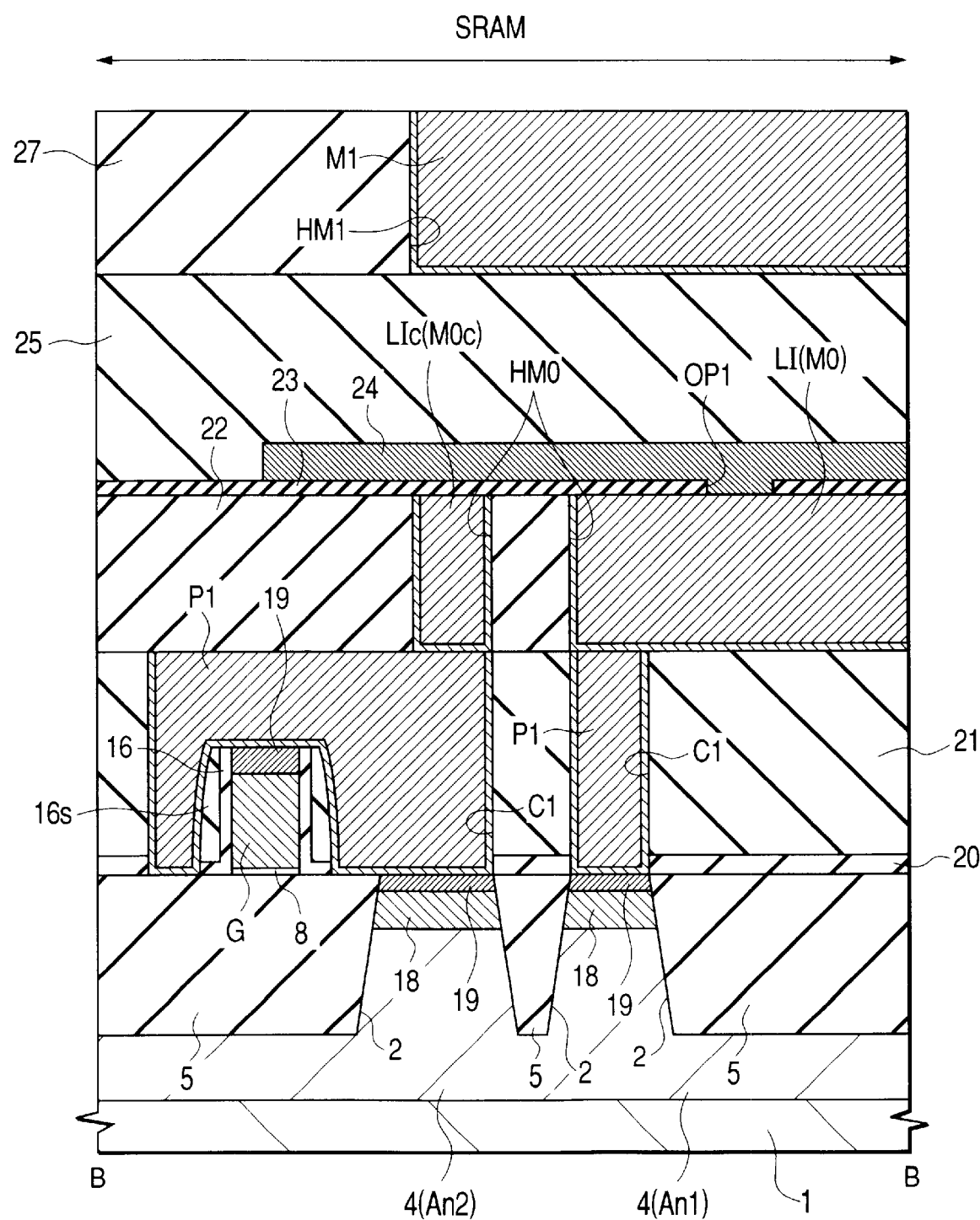
FIG. 36 is a fragmentary cross-sectional view of the substrate showing the method of manufacturing the semiconductor integrated circuit device illustrating the first embodiment of the present invention.
Figure 37:
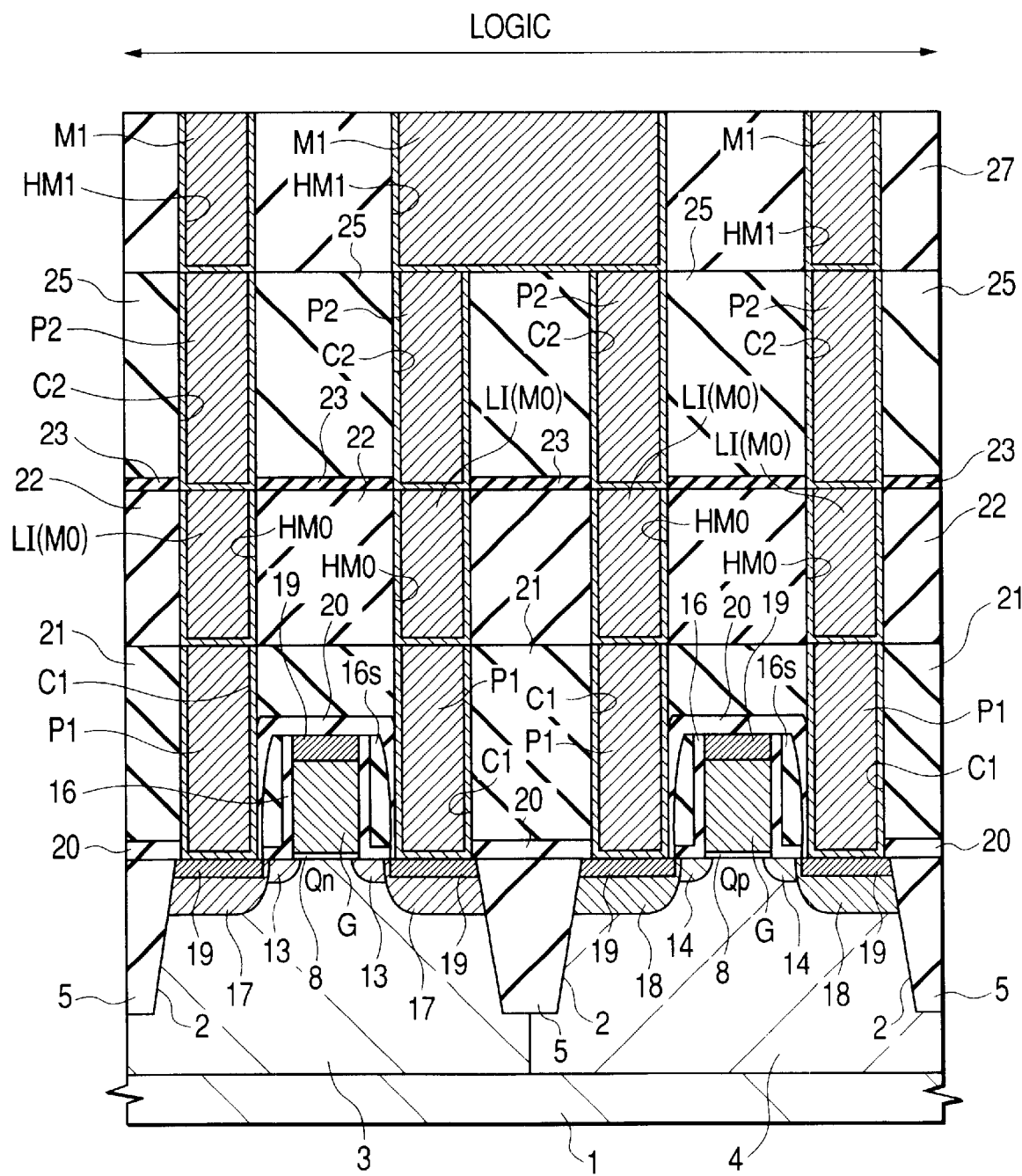
FIG. 37 is a fragmentary cross-sectional view of the substrate showing the method of manufacturing the semiconductor integrated circuit device illustrating the first embodiment of the present invention.
Figure 38:
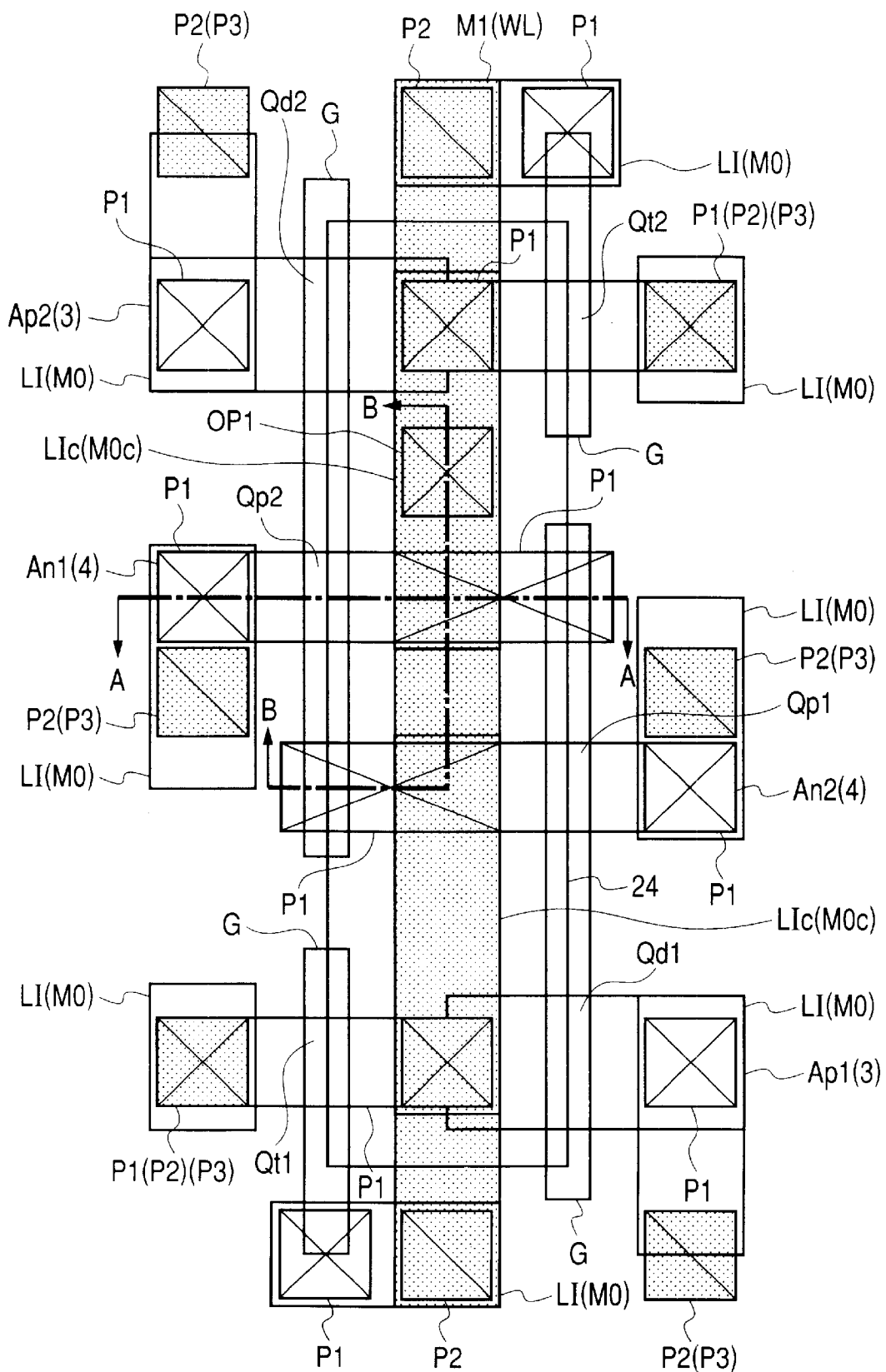
FIG. 38 is a fragmentary plan view of the substrate showing the method of manufacturing the semiconductor integrated circuit device illustrating the first embodiment of the present invention.

Subsequently, as shown in FIGS. 35 through 38, a first layer wiring M1 and plugs P3 are formed over the silicon oxide film 25 and the plugs P2. The first layer wiring M1 and the plugs 3 can respectively be formed as an embedded or buried wiring and embedded plugs formed of a copper film, for example. Now, FIG. 38 is a plan view of the semiconductor substrate showing the region corresponding to about one memory cell formed in the memory cell forming area (SPAM). The drawing on the left side of FIG. 35 is a cross-sectional view taken along line A—A of FIG. 38. FIG. 36 is a cross-sectional view taken along line B—B of FIG. 38. Further, the drawing on the right side of FIG. 35 is a cross-sectional view of an analog capacitor forming area (Analog Capacitor). FIG. 37 is a cross-sectional view of a logic circuit forming area (Logic).

In order to form the first layer wiring M1 and the plugs P3, a silicon oxide film 27 is first deposited over the silicon oxide film 25 and plugs P2 by the CVD method. Next, the silicon oxide film 27 is dry-etched by dry-etching with a photoresist film (not shown) as a mask to thereby form wiring trenches HM1 and contact holes C3. Next, a thin barrier layer comprising, for example, a TiN film is deposited over the silicon oxide film 25 including the interiors of the wiring trenches HM1 and contact holes C3 by the sputtering method or CVD method. Then, a copper (Cu) film is formed on the barrier layer by the sputtering method or plating method. Thereafter, it is etched back and subjected to CMP until the surface of the silicon oxide film 27 is exposed, thereby removing the TiN and Cu films lying outside the wiring trenches HM1 and contact holes C3, whereby the first layer wiring M1 is formed within the wiring trenches HM1 and the plugs P3 are formed within the contact holes C3.

Namely, the first layer wiring M1 (word line WL) for connecting the plug P2 electrically connected to its corresponding gate electrode G of the transfer MISFET Qt1 and the plug P2 electrically connected to its corresponding gate electrode G of the transfer MISFET Qt2 is formed in the memory cell forming area (SRAM). Further, the plugs P3 are formed on the plugs P2 other than the plugs P2 referred to above (see FIG. 38).

The first layer wiring M1 or the like is formed even on the plugs P2 in the logic circuit forming area (Logic) (see FIG. 37). The first layer wiring M1 or the like is formed even on the plugs P2 in the analog capacitor forming area (Analog Capacitor).

Figure 39:
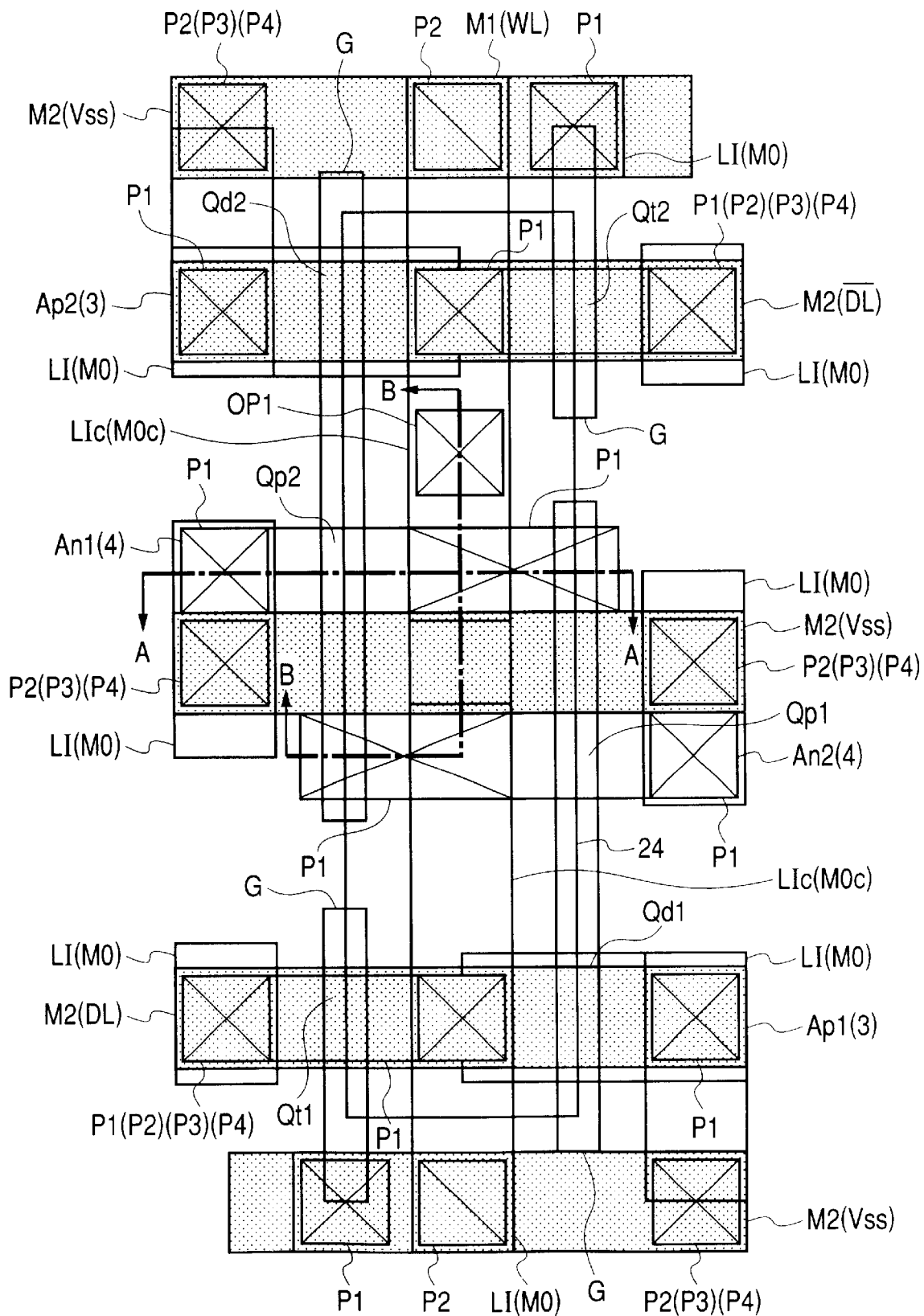
FIG. 39 is a fragmentary plan view of the substrate showing the method of manufacturing the semiconductor integrated circuit device illustrating the first embodiment of the present invention.

Next, as shown in FIG. 39, a silicon oxide film is deposited over the first layer wiring M1, plugs P3 and silicon oxide film 27 by the CVD method. In a manner similar to the contact holes C2 and plugs P2, contact holes C4 and plugs P4 are formed in the silicon oxide film. Now, FIG. 39 is a plan view of the semiconductor substrate showing the region corresponding to about one memory cell formed in the memory cell forming area (SRAM).

Subsequently, a silicon oxide film is deposited over the silicon oxide film and plugs P4 by the CVD method. In a manner similar to the first layer wiring M1, second layer wirings M2 are formed in this film. The second layer wirings M2 and the plugs P4 are omitted from the cross-sectional views of the memory cell forming area (SRAM), analog capacitor forming area (Analog Capacitor) and logic circuit forming area (Logic). Incidentally, the second layer wirings M2 are formed on the plug P4 electrically connected to the source of the drive MISFET Qd1 and the plug P4 electrically connected to the source of the drive MISFET Qd2 so as to connect them as shown in FIG. 39. A ground voltage (Vss) is applied to the second layer wirings M2. The second layer wirings M2 are respectively formed on the plug P4 electrically connected to the source of the load MISFET Qp1 and the plug P4 electrically connected to the source of the load MISFET Qp2 in the direction to intersect the first layer wiring (word line WL) at right angles. A source voltage (Vcc) is applied to the second layer wirings M2. Further, the second layer wirings M2 are respectively formed on the plugs P4 electrically connected to one ends of the transfer MISFETs Qt1 and Qt2 in the direction to intersect the first layer wiring (word line WL) at right angles. The second layer wirings M2 are used as a data line pair DL and /DL (bit line pair).

According to the above process steps, the semiconductor integrated circuit device having the SRAM memory cell, logic circuit and analog capacitor described using FIGS. 1 and 2 is substantially completed.

One example of a circuit having the analog capacitor described in the present embodiment will now be described.

Figure 40:
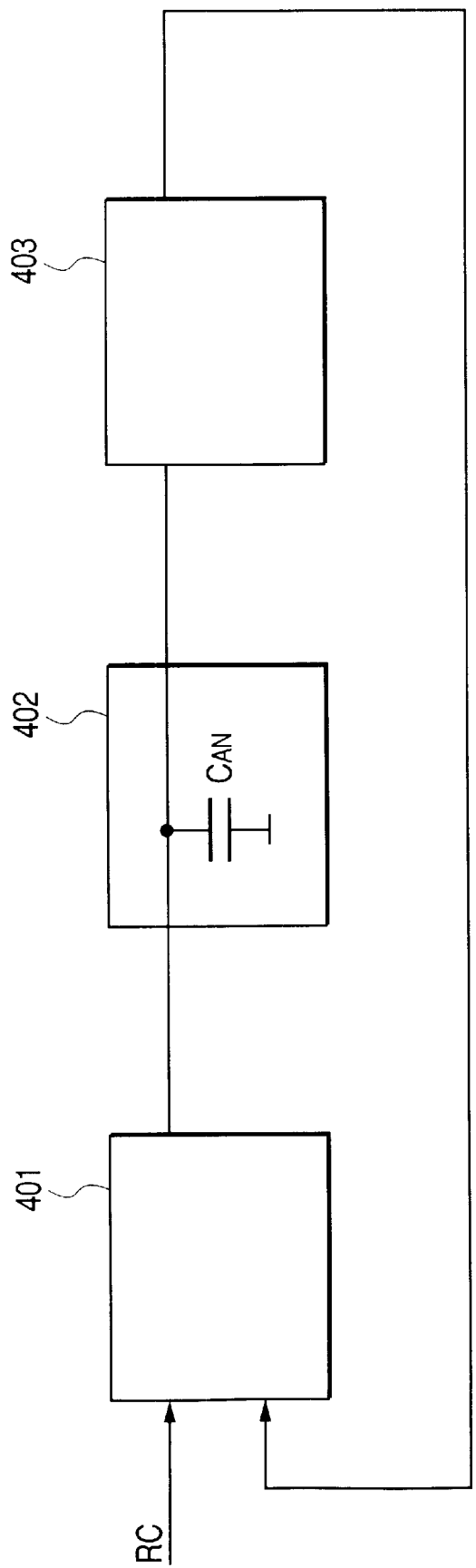
FIG. 40 is a view showing one example of a circuit employed in the semiconductor integrated circuit device illustrative of the first embodiment of the present invention.

FIG. 40 is a diagram showing a configuration of a PLL circuit. Such a PLL circuit has a phase comparator 401, a low-pass filter 402 and a VCO (Voltage Controlled Oscillator) 403. The PLL circuit causes an output signal to oscillate in response to a reference clock RC. An analog capacitor $C_{AN}$ is used for the low-pass filter 402. When the analog capacitor $C_{AN}$ that constitutes such a PLL circuit, is formed using the gate insulating film as described above, a leak current produced due to a tunnel current becomes a problem. When the leak current exceeds $1 \times 10^{-4} A/cm^2$ corresponding to a target value thereof, a time error occurs and hence the normal operation of the PLL circuit is inhibited.

When, however, the analog capacitor $C_{AN}$ described in the present embodiment is used, the thickness of the capacitive insulating film can be ensured as described above, the leak current of the PLL circuit can be reduced, and hence the PLL circuit can be prevented from malfunctioning.

Incidentally, the analog capacitor $C_{AN}$ described in the present embodiment is not limited to the PLL circuit and is widely applicable to a circuit having a capacitor.

Second Embodiment

A semiconductor integrated circuit device according to the present embodiment will next be described in accordance with its manufacturing process. FIGS. 41 through 44 are respectively fragmentary cross-sectional views or plan views of a substrate, showing a method of manufacturing the semiconductor integrated circuit device according to the present embodiment. Incidentally, since the process steps up to the formation of the local wirings L1 (M0) and LIc (M0c) described using FIGS. 2 through 26 are similar to the first embodiment, the description thereof will be omitted.

The semiconductor substrate 1 shown in FIGS. 23 through 26 described in the first embodiment is first prepared. The local wirings LI (M0) and LIc (M0c) shown in these drawings are formed by depositing the thin barrier layer formed of, for example, the TiN film over the silicon oxide film 22 including the interiors of the wiring trenches HM0 formed in the silicon oxide film 22 by the sputtering method, next depositing the conductive film formed of, for example, the W film thereon by the CVD method, and thereafter etching back it or subjecting it to CMP until the surface of the silicon oxide film 22 is exposed, as described in the first embodiment.

Figure 41:
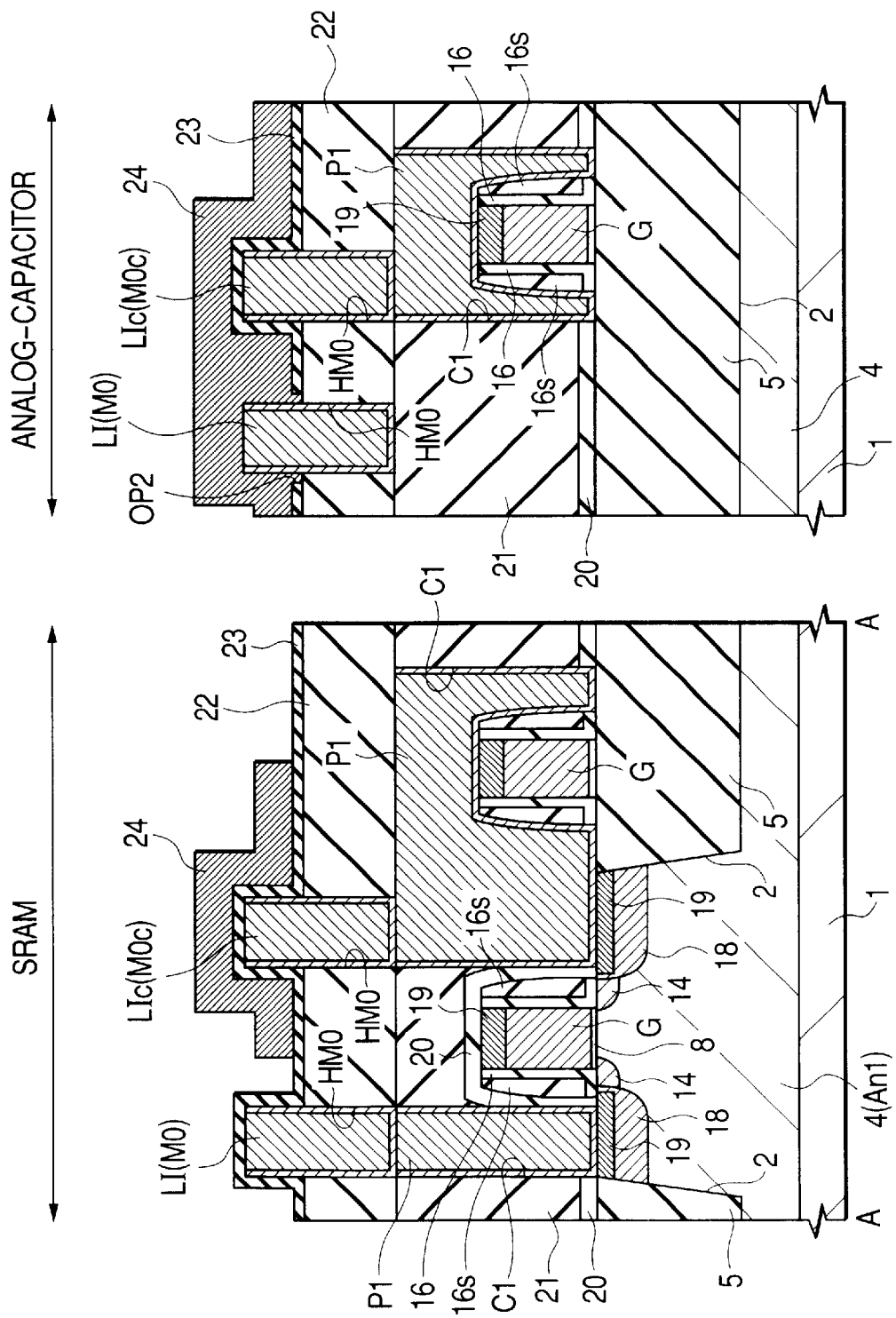
FIG. 41 is a fragmentary cross-sectional view of a substrate showing a method of manufacturing a semiconductor integrated circuit device illustrative of a second embodiment of the present invention.
Figure 42:
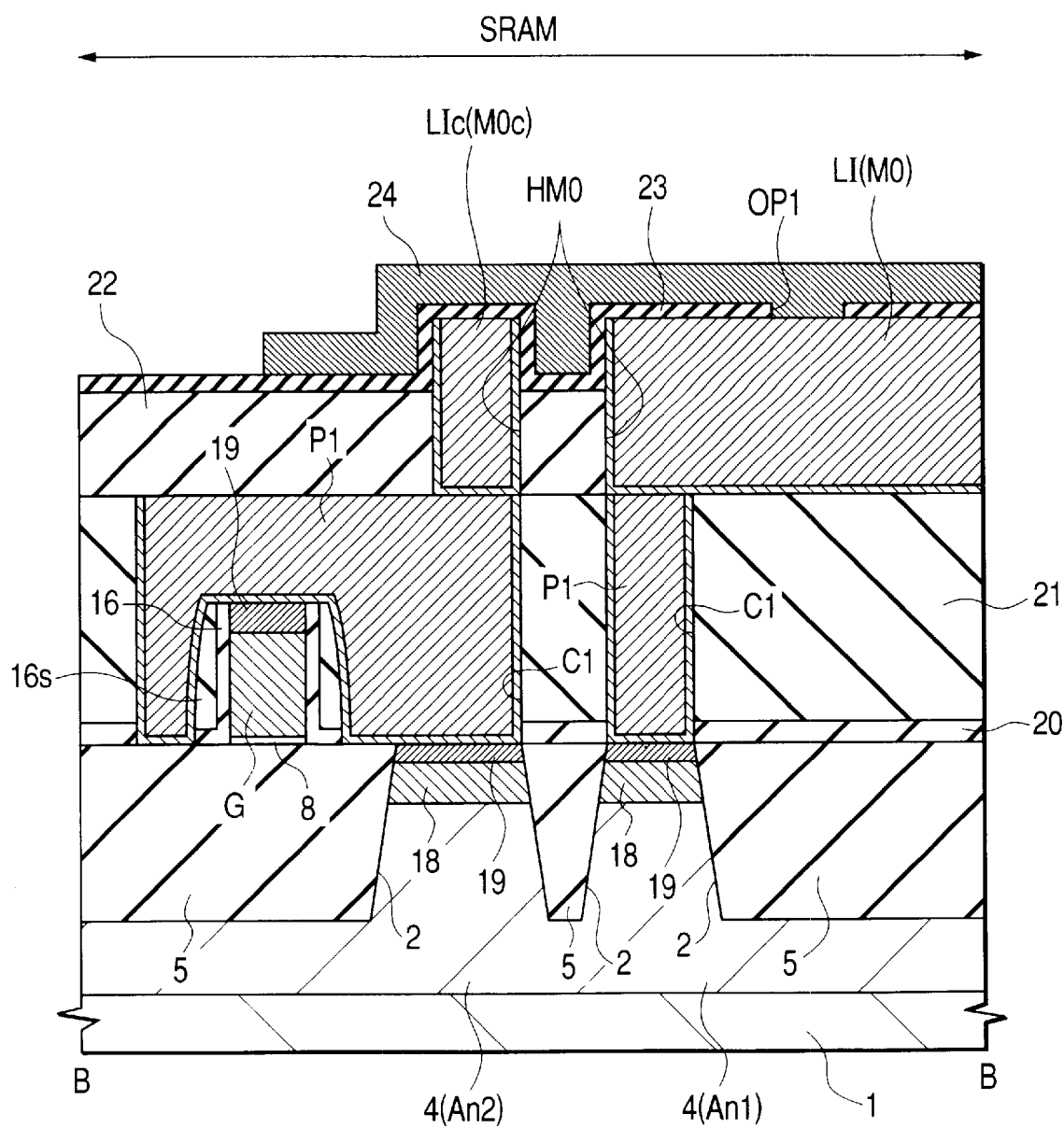
FIG. 42 is a fragmentary cross-sectional view of the substrate showing the method of manufacturing the semiconductor integrated circuit device illustrating the second embodiment of the present invention.
Figure 43:
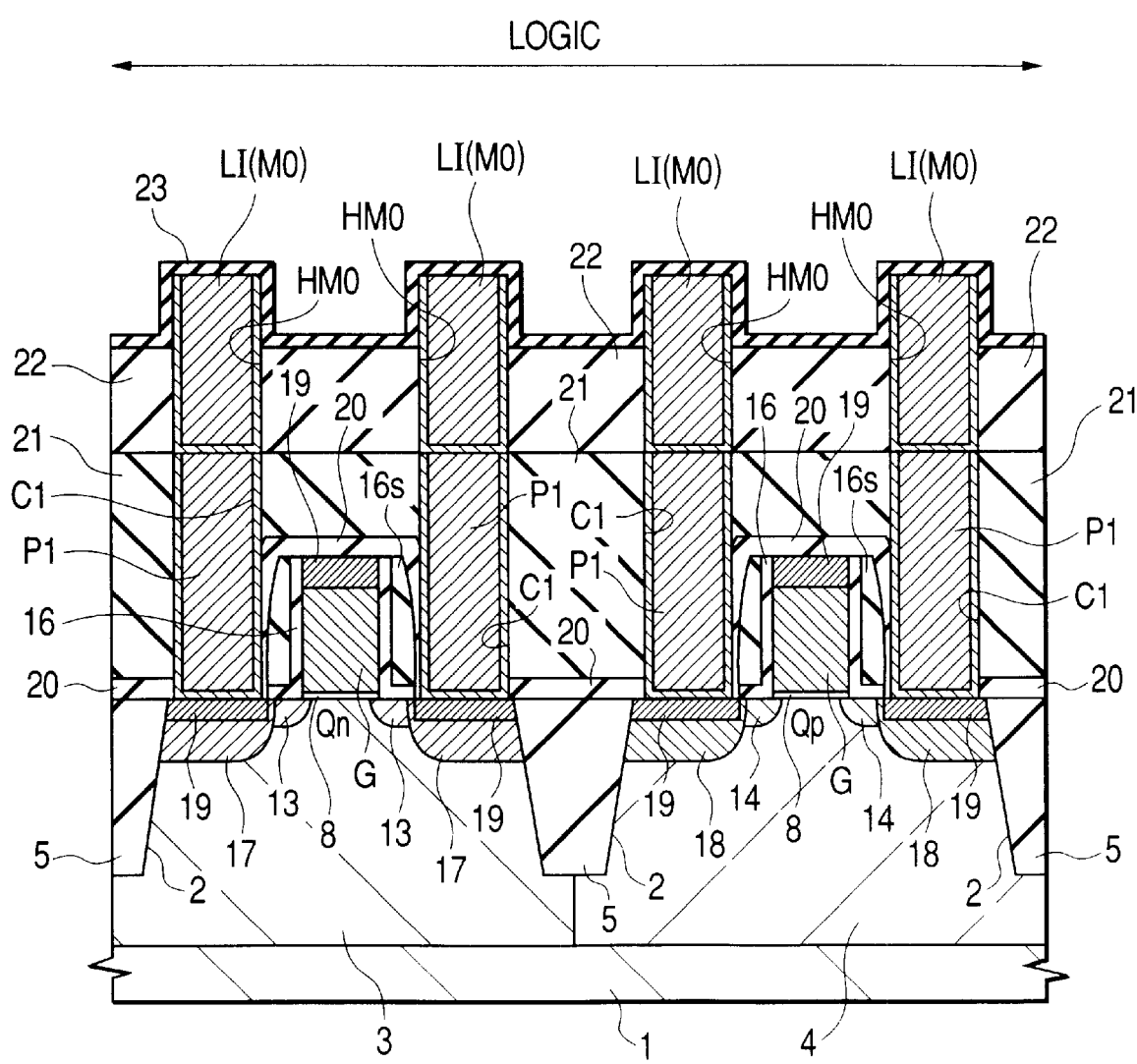
FIG. 43 is a fragmentary cross-sectional view of the substrate showing the method of manufacturing the semiconductor integrated circuit device illustrating the second embodiment of the present invention.
Figure 44:
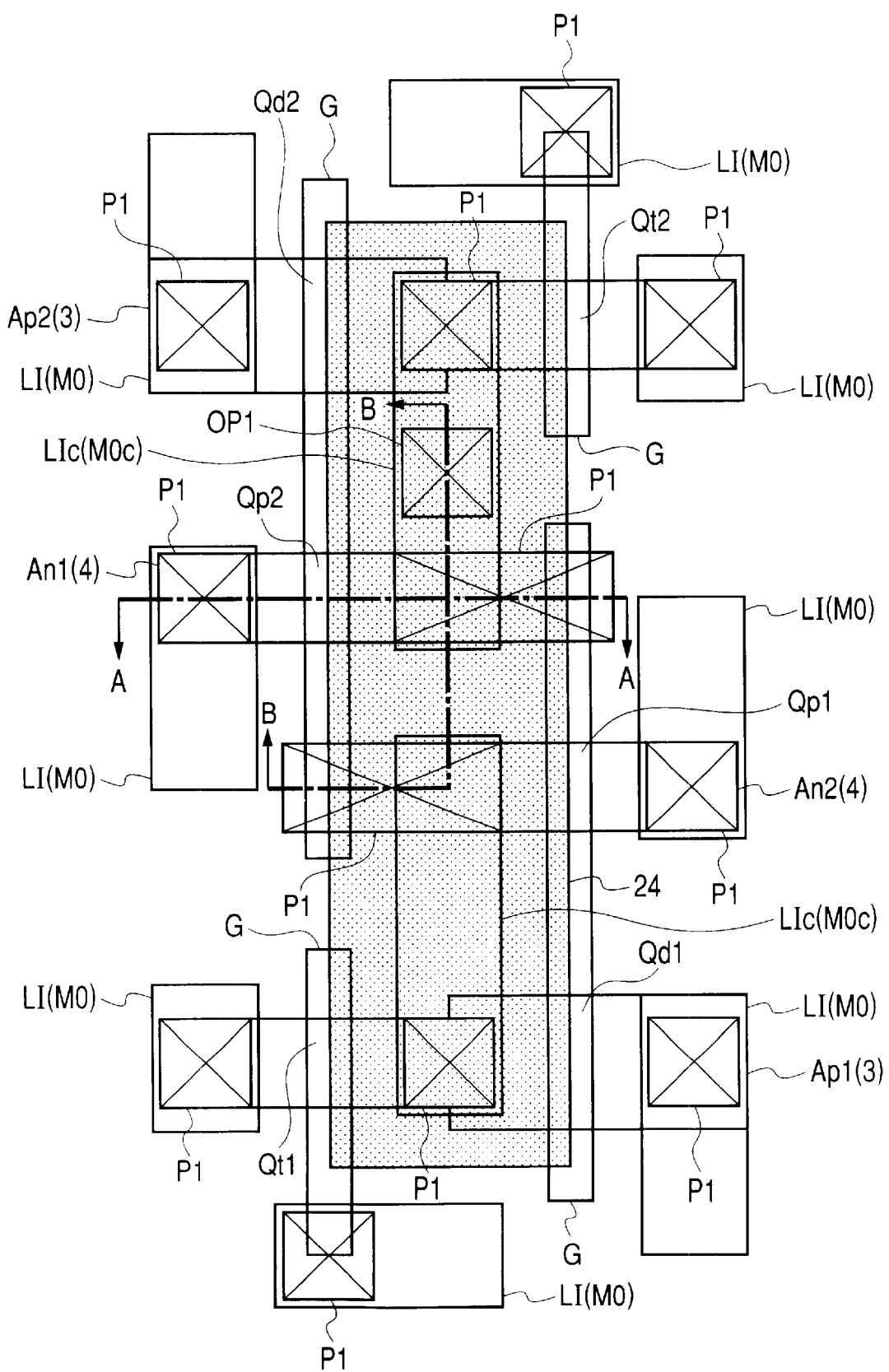
FIG. 44 is a fragmentary plan view of the substrate showing the method of manufacturing the semiconductor integrated circuit device illustrating the second embodiment of the present invention.

In the present embodiment, as shown in FIGS. 41 through 44, the surface of the silicon oxide film 22 is further etched to about 100 nm to expose upper portions of side walls of the local wirings LI (M0) and LIc (M0c). Now, FIG. 44 is a plan view of the semiconductor substrate showing a region corresponding to about one memory cell formed in its corresponding memory cell forming area (SRAM). The drawing on the left side of FIG. 41 is a cross-sectional view taken along line A—A of FIG. 44. FIG. 42 is a cross-sectional view taken along line B—B of FIG. 44. Further, the drawing on the right side of FIG. 41 is a cross-sectional view of an analog capacitor forming area (Analog Capacitor), and FIG. 43 is a cross-sectional view of a logic circuit forming area (Logic).

Next, for example, a silicon nitride film 23 is formed over the silicon oxide film 22 and the local wirings LI (M0) and LIc (M0c). The silicon nitride film 23 is formed between the local wiring LIc (M0c) and the corresponding upper electrode 24 to be described later and serves as a capacitive insulating film. The thickness of the silicon nitride film 23 (capacitive insulating film) is set to about 20 nm when the region corresponding to about one memory cell is $2.0 \mu m^2$, for example.

Next, the silicon nitride film 23 lying on any one of the local wirings LIc (M0c) formed in the memory cell forming area (SRAM) is removed to define an opening OP1 (see FIGS. 34 an 32). Further, the silicon nitride film 23 on its corresponding local wiring LI (M0) formed in the analog capacitor forming area (Analog Capacitor) is removed to define an opening OP2 (see FIG. 31)

Next, for example, a TiN film or a W film is deposited on the silicon nitride film 23 including the interiors of the openings OP1 and OP2 by a sputtering method in a manner similar to the first embodiment and subjected to patterning to thereby form the upper electrode 24 on each local wiring LIc (M0c).

According to the above process steps, a SRAM capacitor $C_{SR}$ comprising the local wiring LIc (M0c), the silicon nitride film 23 and the upper electrode 24 can be formed in the memory cell forming area (SRAM) An analog capacitor $C_{AN}$ comprising the local wiring LIc (M0c), the silicon nitride film 23 and the upper electrode 24 can be formed in the analog capacitor forming area (Analog Capacitor).

Since subsequent process steps are similar to those employed in the first embodiment described while referring to FIGS. 31 through 39, the description thereof will be omitted.

Thus, according to the present embodiment, the surface of the silicon oxide film 22 is further etched after the formation of each local wiring LIc (M0c) in addition to the effect described in the first embodiment. Therefore, the upper portions of the side walls of each local wiring LIc (M0c) are exposed and the silicon nitride film 23 used as the capacitive insulating film can be formed along the side walls. It is thus possible to increase the capacitance.

While the invention made above by the present inventors has been described specifically by the illustrated embodiments, the present invention is not limited to the embodiments. It is needless to say that many changes can be made within the scope not departing from the substance thereof.

An advantageous effect obtained by a typical one of the inventions disclosed in the present application will be described in brief as follows:

A soft error can be reduced owing to the formation of a capacitor between storage nodes of a memory cell of a SRAM.

Such a capacitor and a device having an analog capacitor can be formed on a single substrate, and a reduction in leak current due to these capacitors can be achieved. Voltage dependence of these capacitors can be reduced. It is also possible to reduce variations in capacitance of these capacitors.

As a result, the performance of a semiconductor integrated circuit device having these capacitors can be enhanced.

What is claimed is:

1. A semiconductor integrated circuit device having a memory cell including a pair of n channel type MISFETs having gate electrodes and drains respectively cross-connected with each other, comprising:

an interlayer insulating film formed over the pair of n channel type MISFETs;

a pair of conductive layers formed such that one of the pair of the conductive layers electrically connects a gate electrode of one of the pair of n channel type MISFETs and the drain of another of the pair of n channel type MISFETs and such that another one of the pair of the conductive layers electrically connects a gate electrode of another one of the pair of n channel type MISFETs and the drain of one of the pair of n channel type MISFETs;

a capacitive insulating film formed on the pair of conductive layers and including an opening provided on one of the pair of conductive layers; and an upper electrode formed on the capacitive insulating film and the opening, wherein the interlayer insulating film includes a first insulating film formed on the pair of n channel type MISFETs and a second insulating film formed on the first insulating film, wherein contact holes are formed in the first insulating film, and wiring trenches are formed in the second insulating film, and wherein said conductive layers respectively include connecting portions embedded in the contact holes and local wirings embedded in the wiring trenches.

2. The semiconductor integrated circuit device according to claim 1, wherein the surface of said each conductive layer and the surface of the interlayer insulating film are nearly equal in height.

3. A semiconductor integrated circuit device having a memory cell including a pair of n channel type MISFETs having gate electrodes and drains respectively cross-connected with each other, comprising:

an interlayer insulating film formed over the pair of n channel type MISFETs;

a pair of conductive layers formed such that one of the pair of the conductive layers electrically connects the gate electrode of one of the pair of n channel type MISFETs and the drain of another of the pair of n channel type MISFETs and such that another one of the pair of the conductive layers electrically connects a gate electrode of another one of the pair of n channel type MISFETs and the drain of one of the pair of n channel type MISFETs, said respective conductive layers being formed within trenches defined in the interlayer insulating film;

a capacitive insulating film formed on the pair of conductive layers and including an opening provided on one of the pair of conductive layers; and an upper electrode formed on the capacitive insulating film and the opening, wherein the interlayer insulating film includes a first insulating film formed on the pair of n channel type MISFETs and a second insulating film formed on the first insulating film, wherein contact holes are formed in the first insulating film, and wiring trenches are formed in the second insulating film, and wherein said conductive layers respectively include connecting portions embedded in the contact holes and local wirings embedded in the wiring trenches.

4. The semiconductor integrated circuit device according to claim 3, wherein an end of said each conductive layer is formed over the connecting portion.

5. The semiconductor integrated circuit device according to claim 3, wherein a distance between a back of the upper electrode and the surface of said each conductive layer is shorter than that between the back of the upper electrode and respective surfaces of the connecting portions.

6. The semiconductor integrated circuit device according to claim 3, wherein an area for forming the upper electrode is wider than an area for forming the pair of conductive layers and contains the conductive layer forming area.

7. The semiconductor integrated circuit device according to claim 3, wherein the upper electrode and the pair of conductive layers are respectively a metal film or a metallic compound having conductivity.

8. The semiconductor integrated circuit device according to claim 3, wherein the pair of conductive layers are titanium nitride or tungsten, and the capacitive insulating film is a silicon nitride film.

9. The semiconductor integrated circuit device according to claim 3, wherein a thickness of the capacitive insulating film is greater than or equal to 2.6 nm.

10. A semiconductor integrated circuit device having a memory cell including a pair of n channel type MISFETs having gate electrodes and drains respectively cross-connected with each other, comprising:

an interlayer insulating film formed over the pair of n channel type MISFETs;

a pair of conductive layers formed such that one of the pair of the conductive layers electrically connects the gate electrode of one of the pair of n channel type MISFETs and the drain of another of the pair of n channel type MISFETs and such that another one of the pair of the conductive layers electrically connects a gate electrode of another one of the pair of n channel type MISFETs and the drain of one of the pair of n channel type MISFETs;

said respective conductive layers being formed within trenches defined in the interlayer insulating film, and including upper portions having protrusions which protrude from the surface of the interlayer insulating film;

a capacitive insulating film formed on the interlayer insulating film including the surfaces of the respective protrusions of the pair of conductive layers, said capacitive insulating film having an opening provided on one of the pair of conductive layers; and an upper electrode formed on the capacitive insulating film and the opening, wherein the interlayer insulating film includes a first insulating film formed on the pair of n channel type MISFETs and a second insulating film formed on the first insulating film, wherein contact holes are formed in the first insulating film, and wiring trenches are formed in the second insulating film, and wherein said conductive layers respectively include connecting portions embedded in the contact holes and local wirings embedded in the wiring trenches.

11. A semiconductor integrated circuit device comprising:

a memory cell formed on a first area; and a capacitor element fanned on a second area;

the memory cell including a pair of n channel type MISFETs having gate electrodes and drains respectively cross-connected with each other, an interlayer insulating film formed over the pair of n channel MISFETs, a pair of first conductive layers formed such that one of the pair of first conductive layers electrically connects the gate electrode of one of the pair of n channel type MISFETs and the drain of another of the pair of n channel type MISFETs and such that another of the pair of first conductive layers electrically connects the gate electrode of another of the pair of n channel type MISFETs and the drain of one of the pair of n channel type MISFETs, a first capacitive insulating film formed on the pair of first conductive layers and including an opening provided on one of the pair of first conductive layers, a first upper electrode formed on the first capacitive insulating film and the opening, the interlayer insulating film formed so as to extend to said second area, a second conductive layer formed on the interlayer insulating film, a second capacitive insulating film formed on the second conductive layer, a second upper electrode formed on the second capacitive insulating film, wherein the first and second conductive layers, the first and second capacitive insulating films and the first and second upper electrodes are respectively formed in the same layer.

12. A semiconductor integrated circuit device comprising:

a memory cell formed on a first area; and a capacitor element formed on a second area, the memory cell including a pair of n channel type MISFETs having gate electrodes and drains respectively cross-connected with each other, an interlayer insulating film formed on the pair of n channel MISFETs, a pair of first conductive layers formed such that one of the pair of first conductive layers electrically connects the gate electrode of one of the pair of n channel type MISFETs and the drain of another of the pair of n channel type MISFETs and such that another of the pair of first conductive layers electrically connects the gate electrode of another of the pair of n channel type MISFETs and the drain of one of the pair of n channel type MISFETs, respective ones of the pair of first conductive layers being formed within trenches defined in the interlayer insulating film and including upper electrodes having protrusions which protrude from the surface of the interlayer insulating film, a first capacitive insulating film formed on the interlayer insulating film including the surfaces of the respective protrusions of the pair of first conductive layers and including an opening provided on one of the pair of first conductive layers, a first upper electrode formed on the first capacitive insulating film and the opening, the interlayer insulating film formed so as to extend to said second area, a second conductive layer formed within trenches defined in the interlayer insulating film and including an upper portion having a protrusion which protrudes from the surface of the interlayer insulating film, a second capacitive insulating film formed on the interlayer insulating film including the surface of the protrusion of the second conductive layer, a second upper electrode formed on the second capacitive insulating film, wherein the first and second conductive layers, the first and second capacitive insulating films and the first and second upper electrodes are respectively formed in the same layer.

13. A semiconductor integrated circuit device comprising:

a memory cell formed on a first area; and a capacitor element formed on a second area, the memory cell including a pair of n channel type MISFETs having gate electrodes and drains respectively cross-connected with each other, an interlayer insulating film formed over the pair of n channel MISFETs, a pair of first conductive layers formed such that one of the pair of first conductive layers electrically connects the gate electrode of one of the pair of n channel type MISFETs and the drain of another of the pair of n channel type MISFETs and such that another of the pair of first conductive layers electrically connects the gate electrode of another of the pair of n channel type MISFETs and the drain of one of the pair of n channel type MISFETs, respective ones of the pair of first conductive layers being formed within trenches defined in the interlayer insulating film, a first capacitive insulating film formed on the pair of first conductive layers and including an opening provided on one of the pair of first conductive layers, a first upper electrode formed on the first capacitive insulating film and the opening, the interlayer insulating film formed so as to extend to said second area, a second conductive layer formed within trenches defined in the interlayer insulating film, a second capacitive insulating film formed on the second conductive layer, a second upper electrode formed on the second capacitive insulating film, wherein the first and second conductive layers, the first and second capacitive insulating films and the first and second upper electrodes are respectively formed in the same layer.

14. The semiconductor integrated circuit device according to claim 13, wherein respective surfaces of the first and second conductive layers and the surface of the interlayer insulating film are newly equal in height.

15. The semiconductor integrated circuit device according to claim 13, wherein the application of a voltage to the second upper electrode is carried out from a back of a third conductive layer formed within each hole defined in the interlayer insulating film via the third conductive layer.

16. The semiconductor integrated circuit device according to claim 13, wherein a distance between a back of the first or second upper electrode and the surface of said first or second conductive layer is shorter than that between the back of the first or second upper electrode and the surface of the first or second connecting portion.

17. The semiconductor integrated circuit device according to claim 13, wherein an area for forming the first upper electrode is wider than an area for forming the first conductive layers and contains the first conductive layer forming area, and an area for forming the second upper electrode is wider than an area for forming the second conductive layer and contains the second conductive layer forming area.

18. The semiconductor integrated circuit device according to claim 13, wherein the first and second upper electrodes and the first and second conductive layers are respectively a metal film or a metallic compound having conductivity.

19. The semiconductor integrated circuit device according to claim 13, wherein the first and second conductive layers are titanium nitride or tungsten, and the first and second capacitive insulating films are a silicon nitride film.

20. The semiconductor integrated circuit device according to claim 13, wherein a thicknesses of the first and second capacitive insulating films are greater than or equal to 2.6 nm.

21. The semiconductor integrated circuit device according to claim 13, wherein the second conductive layer is formed on a device isolation insulating film.

22. The semiconductor integrated circuit device according to claim 13, wherein said first conductive layers are connected via a first connecting portion formed in a first insulating film formed on the pair of n channel type MISFETs, and are formed in a second insulating film formed on the first insulating film, and wherein said second conductive layer is connected via a second connecting portion formed in the first insulating film formed so as to extend to said second area and is formed in a second insulating film formed on the first insulating film.

23. The semiconductor integrated circuit device according to claim 22, wherein an end of said each first conductive layer is formed over the first connecting portion.

* * * * *